United States Patent
Smith

(10) Patent No.: US 7,923,369 B2
(45) Date of Patent: Apr. 12, 2011

(54) THROUGH-VIA AND METHOD OF FORMING

(75) Inventor: Bradley P. Smith, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 79 days.

(21) Appl. No.: 12/277,458

(22) Filed: Nov. 25, 2008

(65) Prior Publication Data

US 2010/0130008 A1      May 27, 2010

(51) Int. Cl.
*H01L 21/44* (2006.01)
(52) U.S. Cl. .......... 438/667; 257/E23.141; 257/E21.495
(58) Field of Classification Search .................. 438/667; 257/E23.141, E21.495
See application file for complete search history.

(56) References Cited

U.S. PATENT DOCUMENTS

| | | | |
|---|---|---|---|
| 5,665,633 A | 9/1997 | Meyer | |
| 5,949,125 A | 9/1999 | Meyer | |
| 6,091,130 A | 7/2000 | Oyamatsu et al. | |
| 6,285,066 B1 | 9/2001 | Meyer | |
| 7,030,481 B2 | 4/2006 | Chudzik et al. | |
| 2001/0009809 A1* | 7/2001 | Miwa | 438/689 |
| 2006/0022242 A1 | 2/2006 | Sugatani et al. | |
| 2006/0223301 A1* | 10/2006 | Vanhaelemeersch et al. | 438/618 |
| 2007/0032059 A1 | 2/2007 | Hedler et al. | |
| 2008/0283959 A1* | 11/2008 | Chen et al. | 257/508 |

FOREIGN PATENT DOCUMENTS

EP      1672688 A1      6/2006

OTHER PUBLICATIONS

Lee, K. W. et al.; "Three-Dimensional Shared Memory Fabricated Using Wafer Stacking Technology"; Electron Devices Meeting, 2000 IEDM Technical Digest; Dec. 10-13, 2000; pp. 165-168.
Koyanagi, M. et al.: "Three-Dimensional Integration Technology Based on Wafer Bonding With Vertical Buried Interconnections"; IEEE Transactions on Electron Devices; Nov. 2006; pp. 2799-2808; vol. 53, Issue 11; IEEE.
Non-Final office Action dated Aug. 5, 2010 in U.S. Appl. No. 12/277,455.

* cited by examiner

*Primary Examiner* — Evan Pert
*Assistant Examiner* — Matthew Reames
(74) *Attorney, Agent, or Firm* — Joanna G. Chiu; Kim-Marie Vo

(57) ABSTRACT

In one embodiment, a method of forming a via includes forming an first opening in the semiconductor substrate, wherein the first opening has a bottom and sidewalls, forming a sacrificial fill in the first opening, forming a dielectric layer over the sacrificial fill, forming a second opening in the dielectric layer, wherein the second opening is over the sacrificial fill, removing the sacrificial fill from the first opening after forming the second opening, and forming a conductive material in the first opening and second opening.

20 Claims, 22 Drawing Sheets

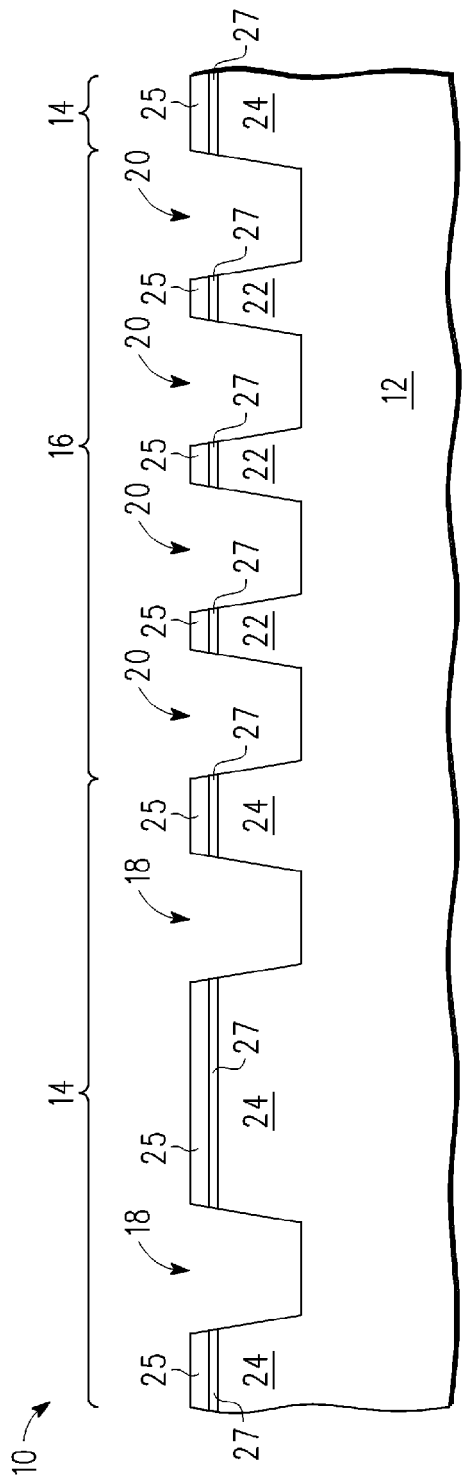
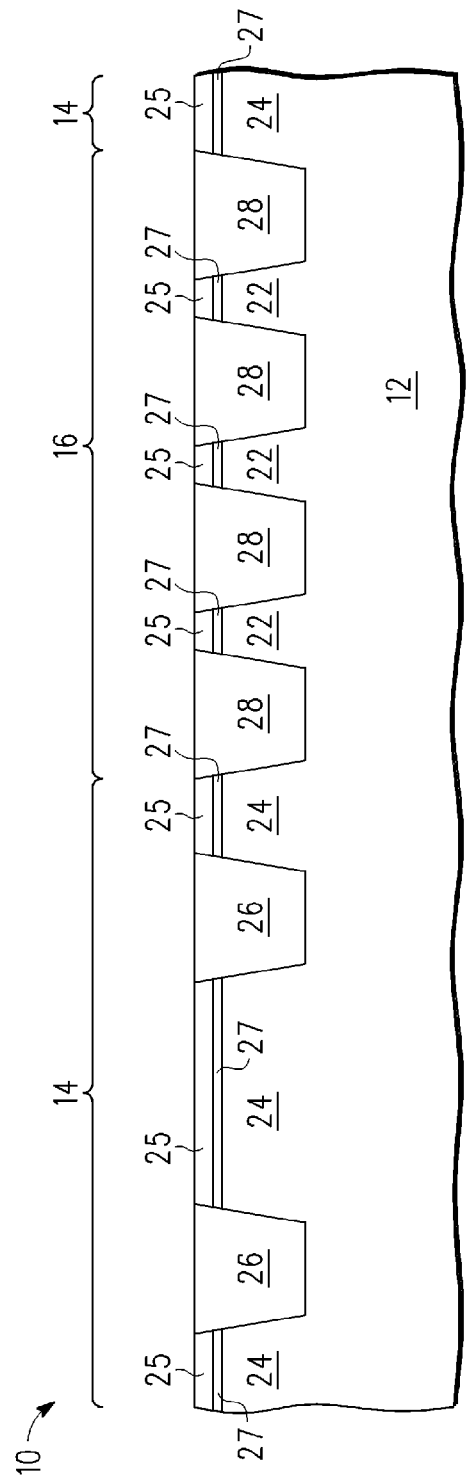
FIG. 1
FIG. 2

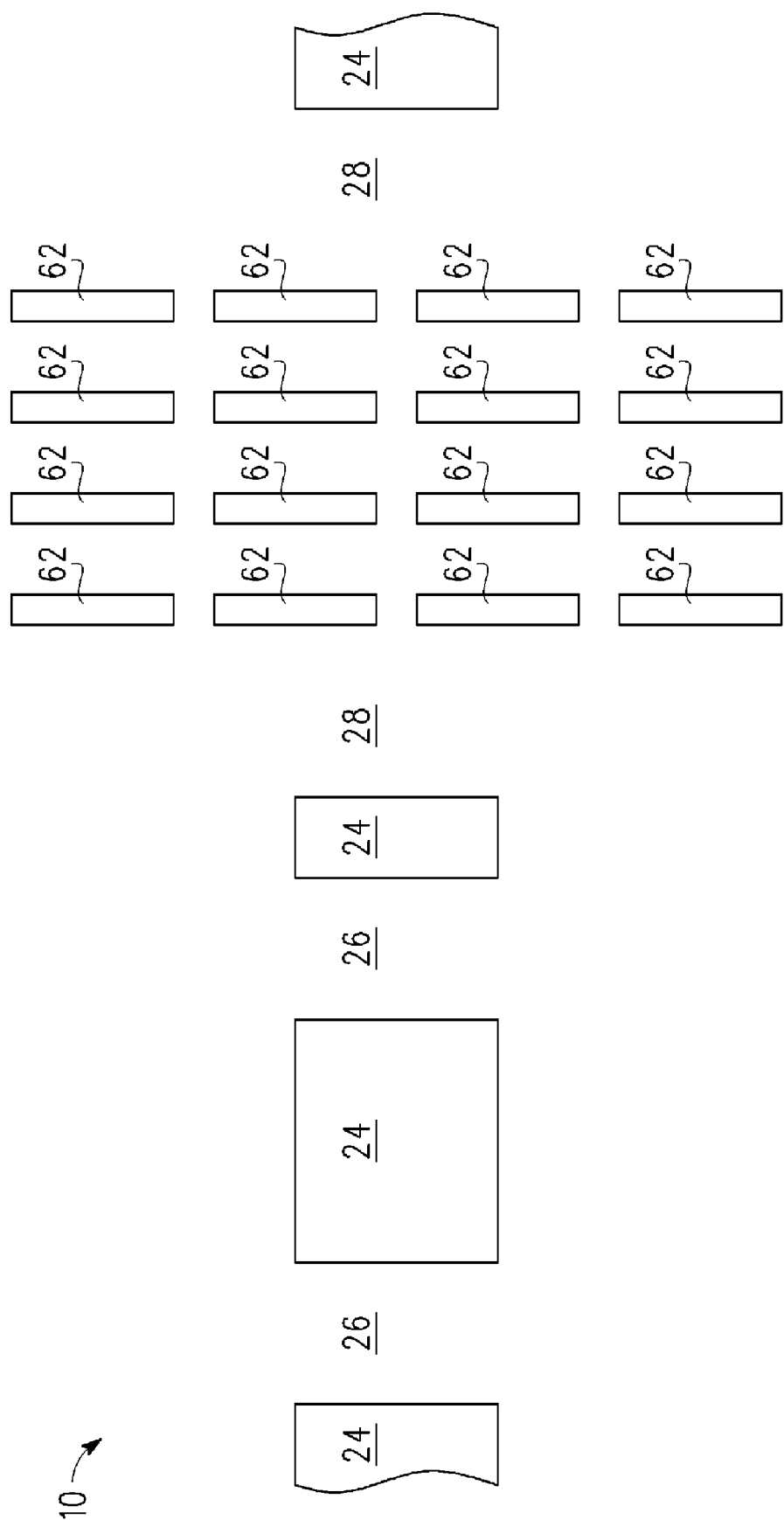

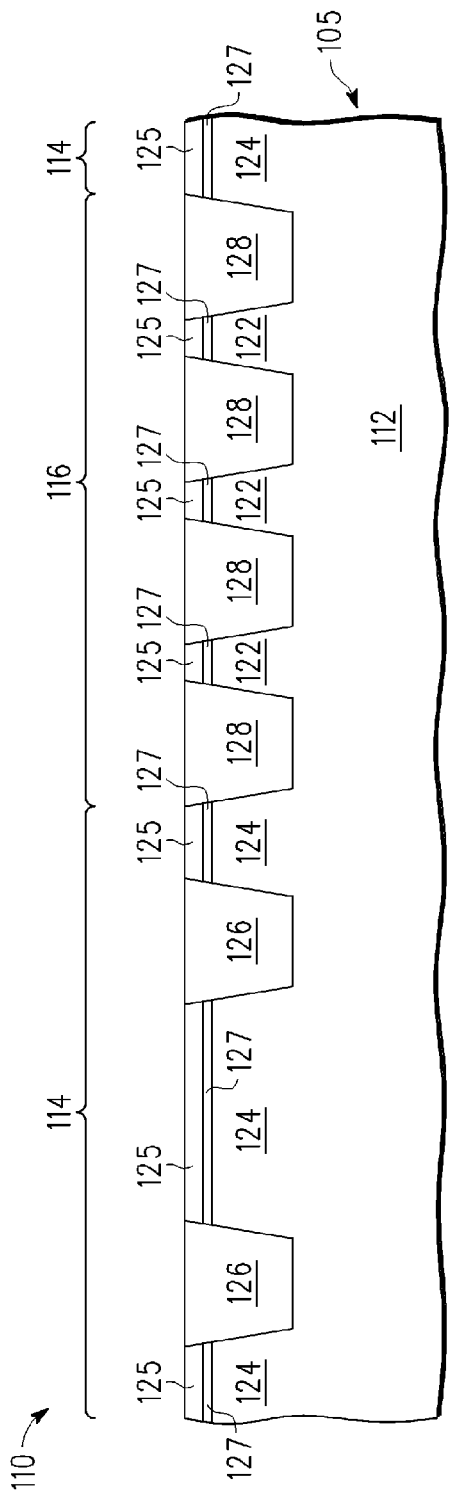
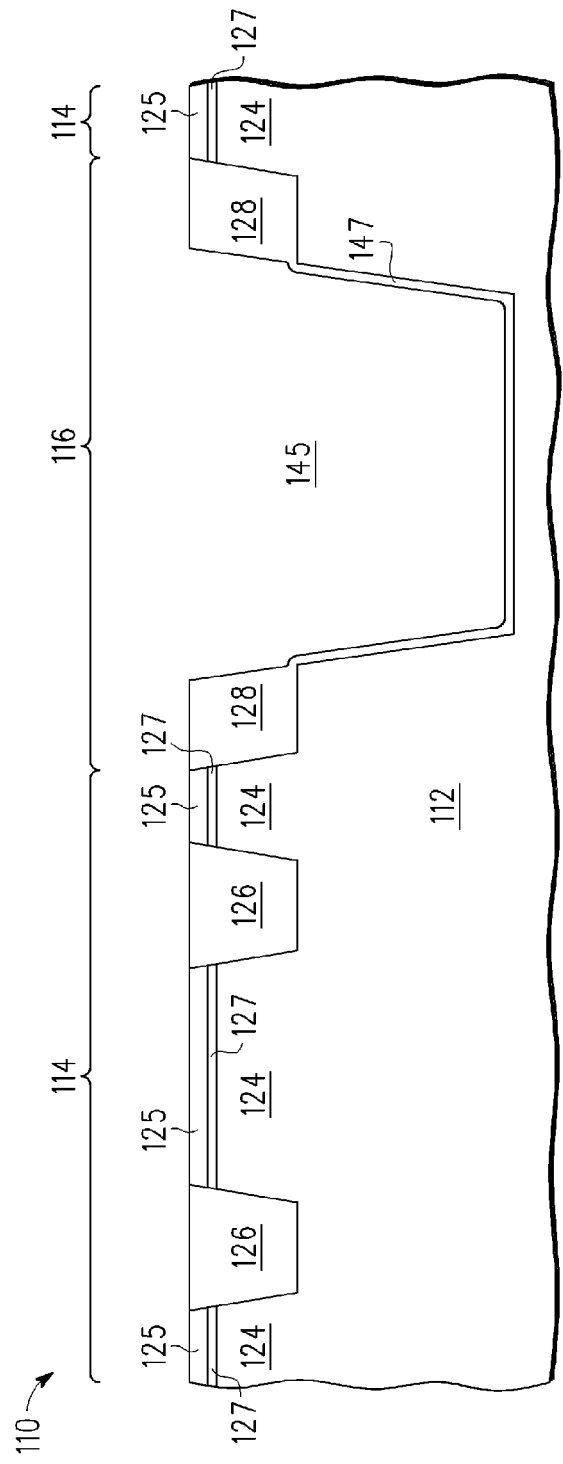

THROUGH-VIA AND METHOD OF FORMING

CROSS-REFERENCE TO RELATED APPLICATION(S)

This application is related to Ser. No. 12/277,455, filed on even date, entitled "Through-Via and Method of Forming," naming Bradley P. Smith as inventor, and assigned to the current assignee hereof.

BACKGROUND

1. Field

This disclosure relates generally to semiconductor processing, and more specifically, to through-via formation.

2. Related Art

As consumers demand smaller and faster electronic products, the industry has moved to 3-dimensional (3D) integration of semiconductor devices. For example, through-vias or buried interconnects may be used to allow connections on the backsides of semiconductor dies which, for example, allow semiconductor dies to be stacked in a 3D interconnect system. However, through-vias can be large in area, where these large areas can result in planarization problems during the formation of the semiconductor die. Therefore, there is a need for improved through-via formation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 illustrates, in cross section form, a semiconductor workpiece having isolation openings in a semiconductor substrate, in accordance with one embodiment of the present invention.

FIG. 2 illustrates, in cross section form, the semiconductor workpiece of FIG. 1 after forming isolation regions, in accordance with one embodiment of the present invention.

FIGS. 9 and 10 illustrate top down views of a semiconductor workpiece in accordance with various embodiments of the present invention.

FIG. 11 illustrates, in cross section form, a semiconductor workpiece having isolation regions in a semiconductor substrate in accordance with one embodiment of the present invention.

FIG. 12 illustrates, in cross section form, the semiconductor workpiece of FIG. 11 after formation of an opening in the substrate, in accordance with one embodiment of the present invention.

DETAILED DESCRIPTION

Figure 3:
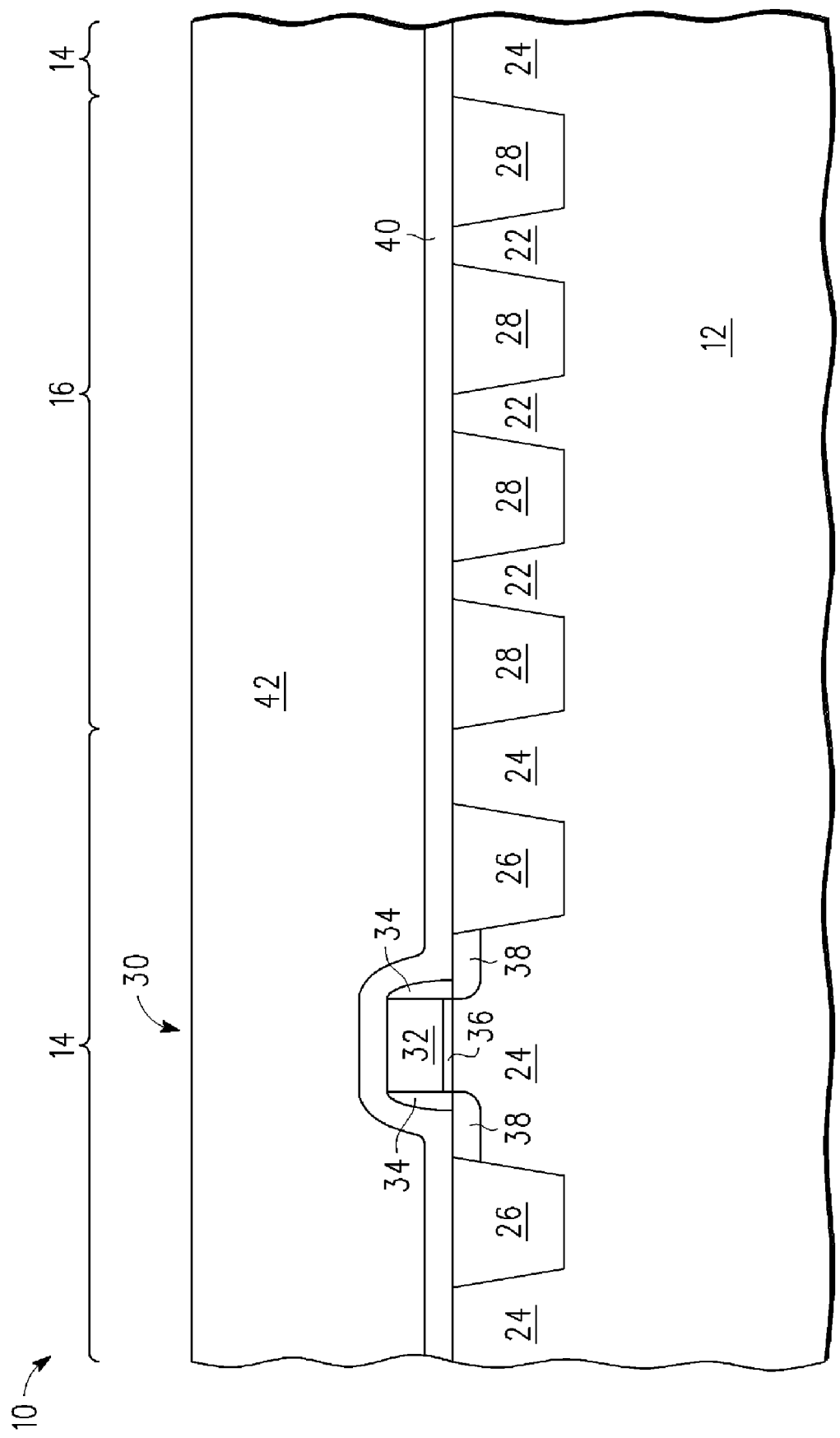
FIG. 3 illustrates, in cross section form, the semiconductor workpiece of FIG. 2 after forming a transistor, an etch stop layer, and a dielectric layer, in accordance with one embodiment of the present invention.

Sacrificial features may be formed between isolation openings in through-via regions. The isolation openings are filled with oxide and planarized. The sacrificial features decrease dishing during the planarization. After planarization, devices may be formed in active regions of the semiconductor substrate. A dielectric layer is formed over the devices and the sacrificial features. A through-via opening is formed that extends through the dielectric layer to the substrate and removes the sacrificial features. The through-via opening is filled with a conductive material to form a through-via. Afterwards, a portion of the substrate is then removed to expose the through-via. In addition, an opening in the semiconductor substrate may be created and a material including silicon, such as polysilicon, may be formed in the opening prior to forming the sacrificial features. Hence, one or more sacrificial features may be present in the material including silicon. The material including silicon (and the sacrificial features in this material, if present) are removed prior to forming an opening in the dielectric layer. However, the sacrificial features may not be formed when forming the material including silicon in the semiconductor substrate.

FIG. 1 illustrates, in cross section form, a semiconductor workpiece 10 which includes a semiconductor substrate 12. Note that workpiece 10 may be part of a semiconductor wafer and may also be referred to as a semiconductor die which is located in a semiconductor wafer. Semiconductor substrate 12 can be any semiconductor material or combination of materials, such as gallium arsenide, silicon germanium, silicon, monocrystalline silicon, the like, and combination thereof. Semiconductor substrate 12 can either be a bulk substrate or a semiconductor-on-insulator (SOI) substrate. An insulating layer 27 is formed over substrate 12 and an etch stop layer 25 is formed over insulating layer 27. In one embodiment, insulating layer 27 is an oxide layer and etch stop layer 25 is a nitride layer. A plurality of isolation openings 18 and 20 are formed through insulating layer 27 and etch stop layer 25 and into substrate 12. Workpiece 10 includes multiple regions, such as active region 14 and through-via region 16. Active region 14 includes active circuitry such as transistors and other semiconductor devices whereas through-via region 16 is devoid or transistors or semiconductor devices. Through-via region 16 is a region of workpiece 10 in which through-vias can be formed without affecting the active circuitry in active regions 14. Workpiece 10, in through-via region 16, includes sacrificial features 22 located between openings 20. Workpiece 10, in active region 14, includes non-sacrificial features 24 located between openings 18. For example, in through-via region 16, each opening of openings 20 is adjacent at least one sacrificial feature of sacrificial features 22, and in active region 14, each opening of openings 18 is adjacent at least one non-sacrificial feature of non-sacrificial features 22. Note that, in the illustrated embodiment, both sacrificial features 22 and non-sacrificial features 24 are portions of substrate 12.

FIG. 2 illustrates, in cross section form, semiconductor workpiece 10 after forming isolation regions 26 and 28, in accordance with one embodiment of the present invention. Openings 18 and 20 are filled with an insulating material, such as an oxide, and planarized to etch stop layer 25. Isolation regions 26 are located within active region 14 and isolation regions 28 are located within through-via region 16. Note that isolation regions 28 are closer to an edge 5 of workpiece 10 as compared to isolation regions 26. In through-via region 16, sacrificial features 22 are located between isolation regions 28. In active region 14, non-sacrificial features 24 are located between isolation regions 26. For example, in through-via region 16, each sacrificial feature of sacrificial features 22 is between two isolation regions of isolation regions 28, and in active region 14, each non-sacrificial feature of non-sacrificial features 24 is between two isolation regions of isolation regions 26. Note that the presence of sacrificial features 22 prevents dishing from occurring in through-via regions 16 during planarization of the insulating material. That is, without sacrificial features 22, isolation regions 28 would form a single, large-area, isolation region. In this case, this large-area isolation layer may be more susceptible to dishing during planarization of the insulating material. Therefore, the use of sacrificial features 22 helps prevents this dishing which may allow for better integrity of subsequently formed layers. Furthermore, as will be discussed below, sacrificial features 22 will eventually be removed during formation of a through-via. In one embodiment, sacrificial features 22 are each less than a predetermined size such that they erode during a subsequent etch to form an opening in substrate 12 for forming the through-via. In one embodiment, sacrificial features 22 are parallel to each other. In one embodiment, sacrificial features 22 each have a same depth.

FIG. 3 illustrates, in cross section form, semiconductor workpiece 10 after forming a transistor 30, an etch stop layer 40, and a dielectric layer 42, in accordance with one embodiment of the present invention. A transistor 30 is formed in and on substrate 12, between isolation regions 26. Transistor 30 is an exemplary semiconductor device and can be formed in a variety of different manners. Note that transistor 30 may also be referred to as device 30. In the illustrated embodiment, transistor 30 includes a gate dielectric 36 over substrate 12, a gate electrode 32 over gate dielectric 36, sidewall spacers 34 over substrate 12 and adjacent gate electrode 32, and source/drain regions 38 in substrate 12 on either side of gate electrode 32, between two isolation regions of isolation regions 26. Therefore, note that a channel region of transistor 30, located in substrate 12, under gate dielectric 36, and between source/drain regions 38, is formed in a non-sacrificial feature 24 of active region 14. In alternate embodiments, active region 14 may include other types of transistors, devices, and circuitry. In one embodiment, an etch stop layer 40 is deposited over transistor 30, isolation regions 26, and substrate 12 in active region 14 and over isolation regions 28 and substrate 12 in through-via region 16. In one embodiment, etch stop layer 40 is a nitride layer. In one embodiment, a dielectric layer 42 is deposited over etch stop layer 40. Note that dielectric layer 42 may also be referred to as a pre-metal dielectric (PMD) and may be formed of multiple layers.

Figure 4:
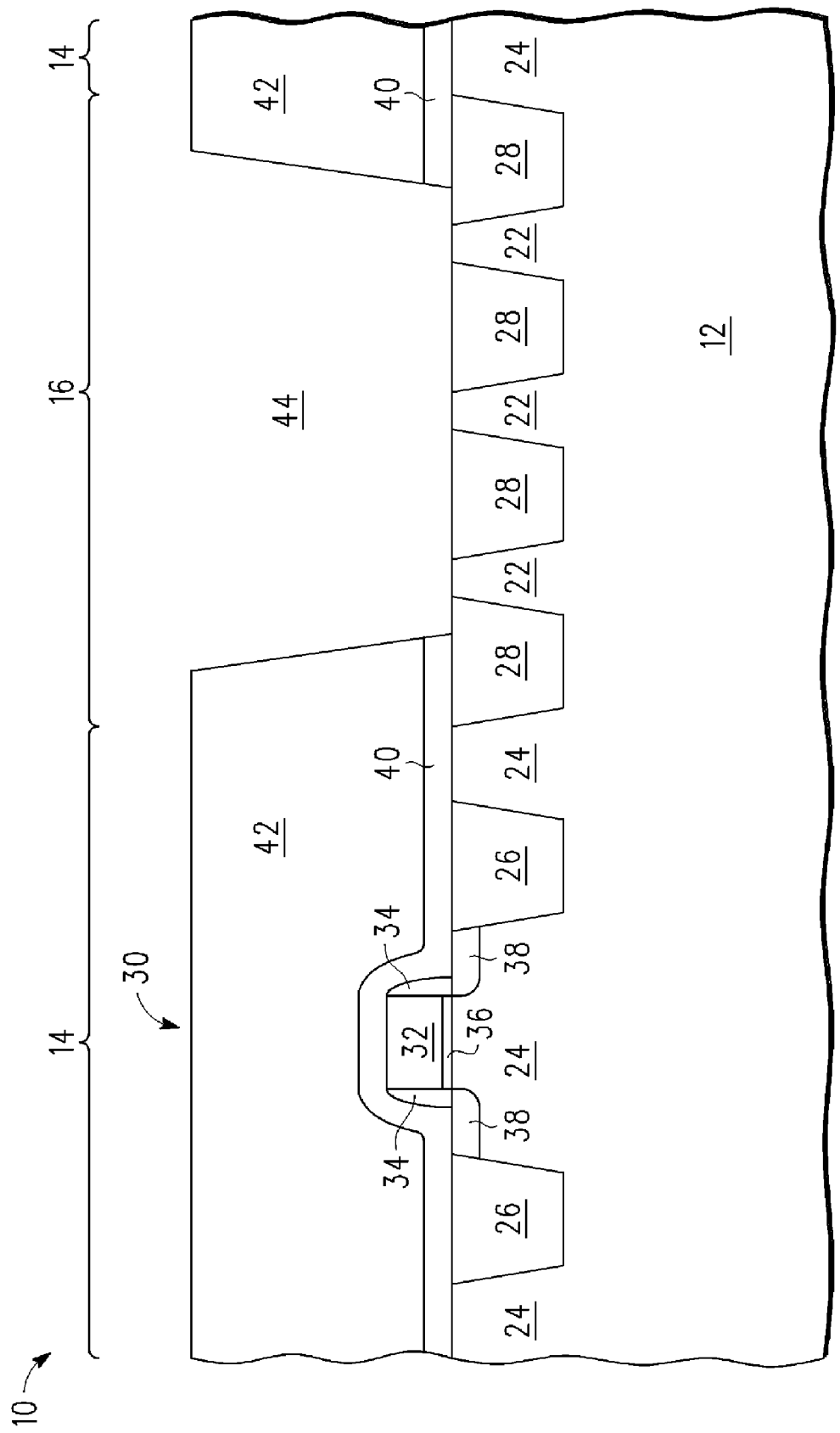
FIG. 4 illustrates, in cross section form, the semiconductor workpiece of FIG. 3 after formation of an opening in the dielectric layer and the etch stop layer, in accordance with one embodiment of the present invention.

FIG. 4 illustrates, in cross section form, semiconductor workpiece 10 after formation of a first portion of a through-via opening 44 through dielectric layer 42 and etch stop layer 40, in accordance with one embodiment of the present invention. Note that opening 44 is formed in through-via region 16 and exposes a portion of isolation regions 28 as well as sacrificial features 22.

Figure 5:
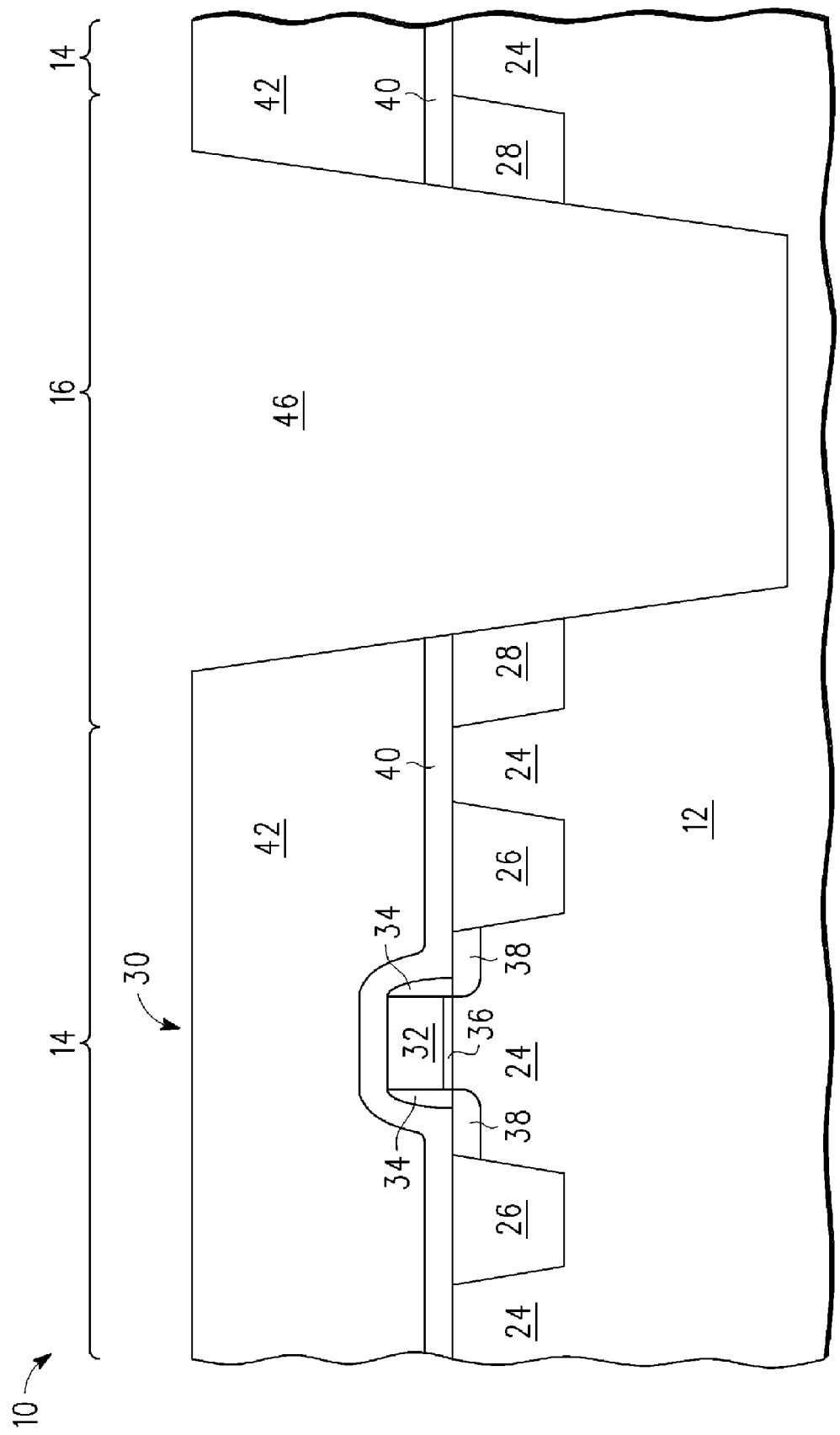
FIG. 5 illustrates, in cross section form, the semiconductor workpiece of FIG. 4 after extending the opening of FIG. 4 into the substrate in accordance with one embodiment of the present invention.

FIG. 5 illustrates, in cross section form, semiconductor workpiece 10 after extending the first portion of through-via opening 44 into substrate 12 to form through-via opening 46 in accordance with one embodiment of the present invention. Therefore, through-via opening 46 extends into substrate 12, below isolation regions 28. Also, since sacrificial features 22 are smaller than a predetermined size, they are fully eroded during the formation of through-via opening 46.

Figure 6:
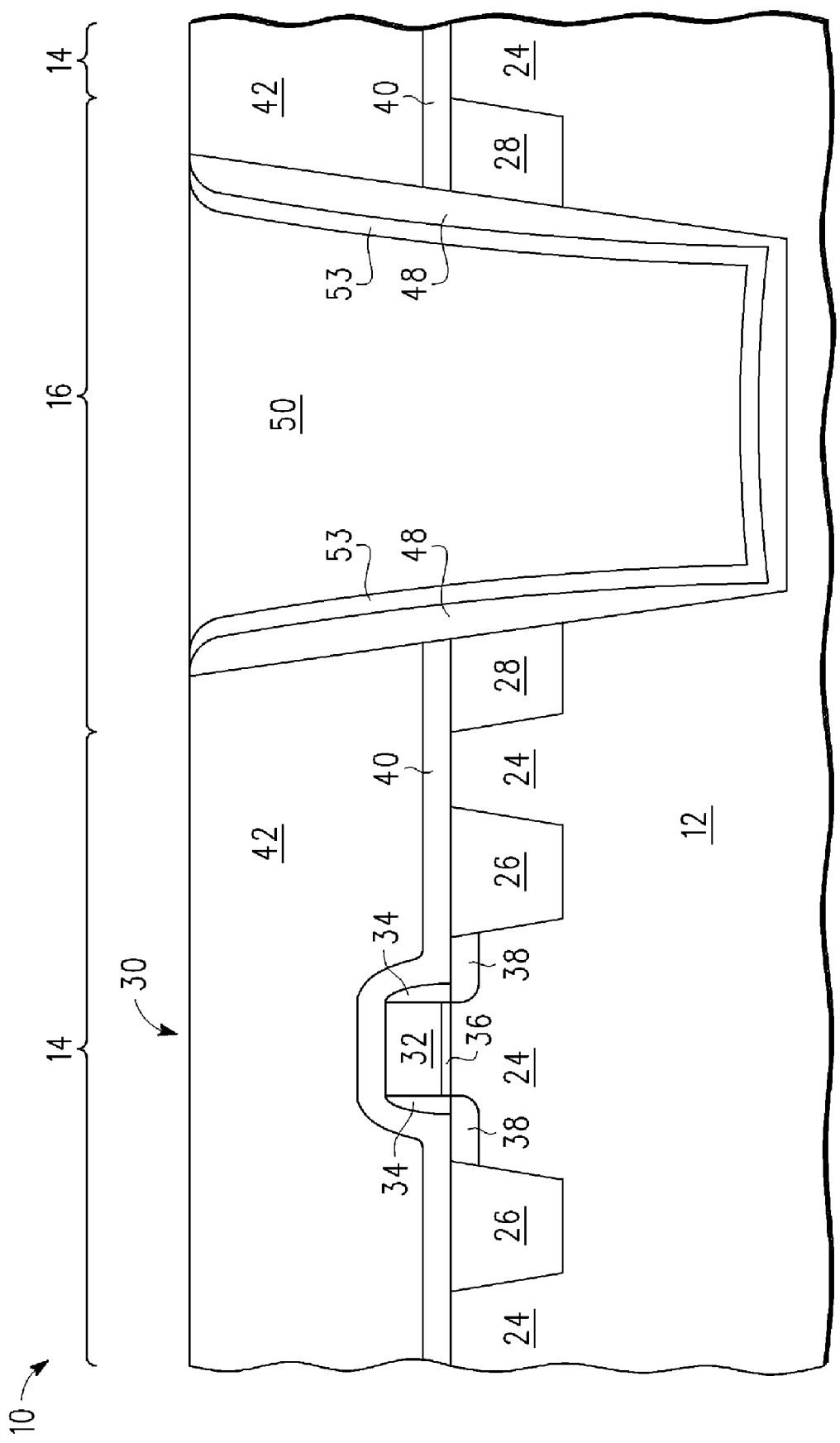
FIG. 6 illustrates, in cross section form, the semiconductor workpiece of FIG. 5 after formation of a liner layer, a barrier layer, and a through-via in accordance with one embodiment of the present invention.

FIG. 6 illustrates, in cross section form, semiconductor workpiece 10 after formation of a liner layer 48, a barrier layer 53, and a through-via 50 in accordance with one embodiment of the present invention. In one embodiment, liner layer 48 is a dielectric layer. In one embodiment, liner layer 48 may be formed using chemical vapor deposition (CVD) and may include multiple layers. Also, liner layer 48 may also be referred to as a collar. Liner layer 48 is formed in through-via opening 46, along the bottom and sidewalls of opening 46. In one embodiment, liner layer 48 includes an oxide. In one embodiment, barrier layer 53 is a conductive layer formed over liner layer 48 within opening 46. In one embodiment, barrier layer 53 includes tantalum. After formation of barrier layer 53, opening 46 is filled with a conductive material to form a conductive through-via 50. In one embodiment, the conductive material used to form through-via 50 includes copper or tungsten.

Figure 7:
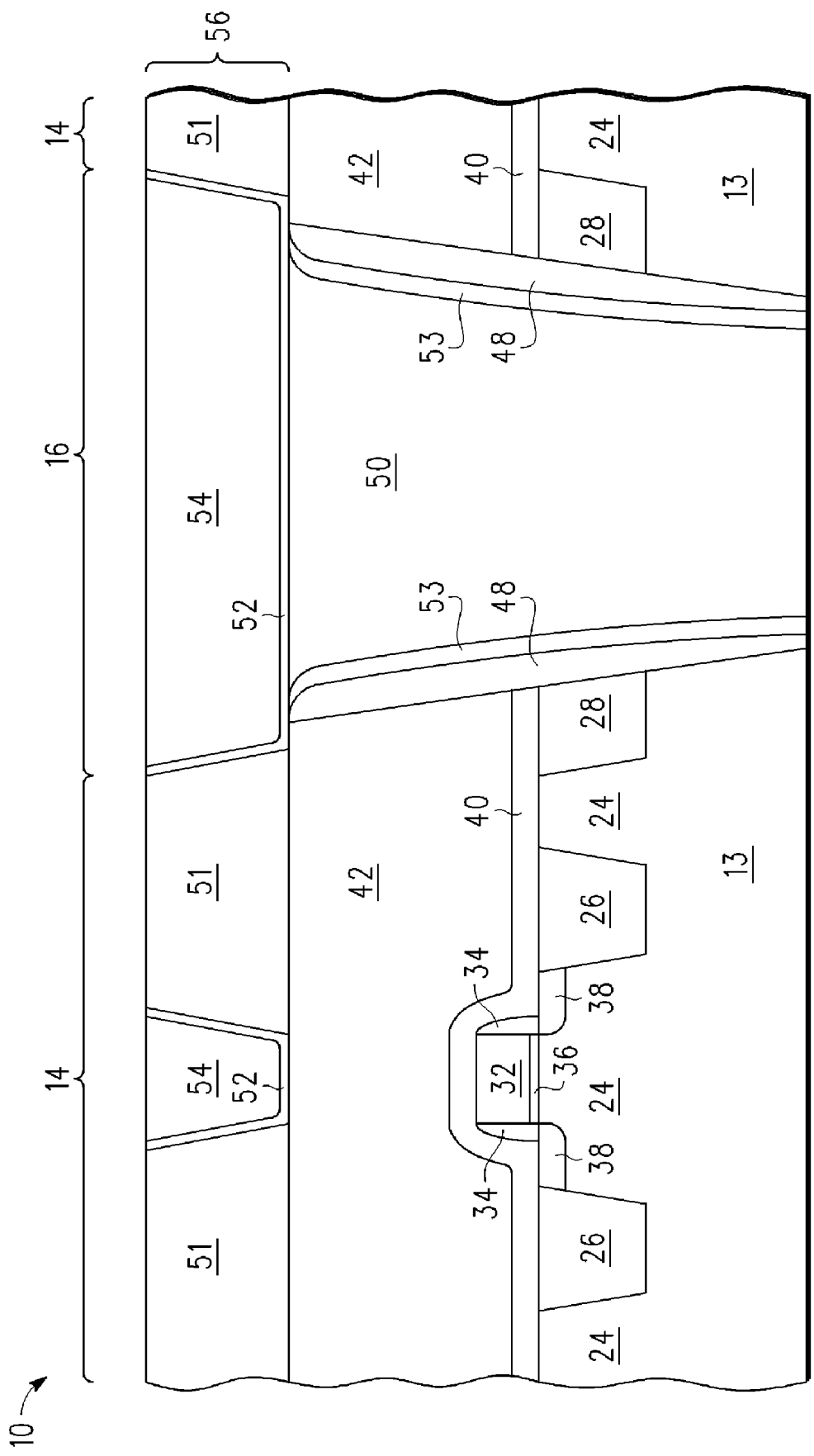
FIG. 7 illustrates, in cross section form, the semiconductor workpiece of FIG. 6 after formation of an interconnect layer and after exposing the through-via in accordance with one embodiment of the present invention.

FIG. 7 illustrates, in cross section form, semiconductor workpiece 10 after formation of an interconnect layer 56 and after exposing through-via 50 in accordance with one embodiment of the present invention. After filling opening 46 to form through-via 50, an interconnect layer 56 is formed over dielectric layer 42 and through-via 50. In one embodiment, a dielectric layer 51 is formed over dielectric layer 42 and through-via 50. Openings are formed in dielectric layer 51 exposing dielectric layer 42 and through-via 50. Within each of these openings, a conductive barrier layer 52 is formed along the bottom and sidewalls of the opening. These openings are then filled with a conductive material to form conductive regions 54. Therefore, interconnect layer 56 includes conductive regions 54 within dielectric layer 51 to route signals. Note that, in the illustrated embodiment, one of conductive regions 54 is in electrical contact with through-via 50 which may be used to route signals through-via 50. In alternate embodiments, workpiece 10 may include any number of interconnect layers, such as interconnect layer 56, as needed to route signals. Also, as illustrated in FIG. 7, after formation of interconnect layer 56, substrate 12 is thinned to form thinned substrate 13 and expose through-via 50 at a bottom surface of substrate 13, which is opposite a top surface of substrate 13 on which etch stop layer 40 and dielectric layer 42 are formed. Therefore, through-via 50 allows signals from circuitry in active regions 14 to be routed through one or more interconnect layers on a top surface of substrate 13 down through substrate 13 itself to the bottom surface of substrate 13, opposite the top surface.

Figure 8:
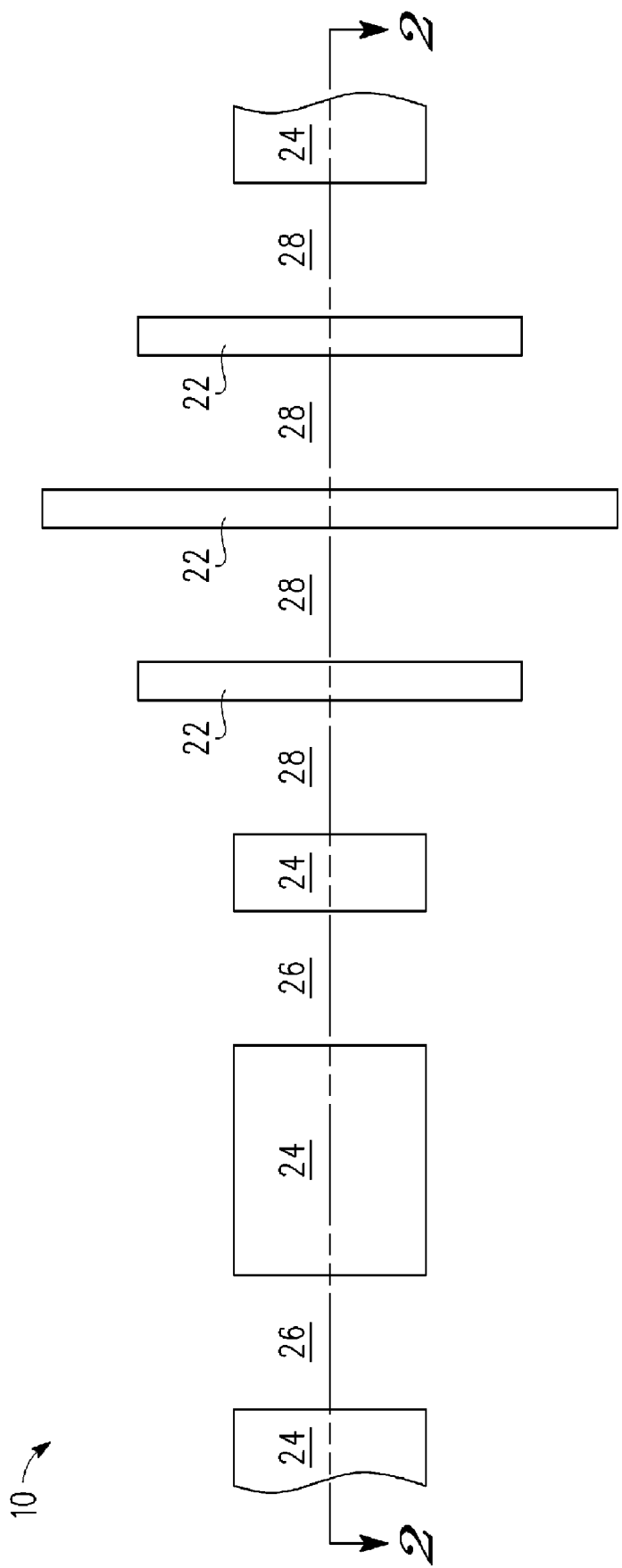
FIG. 8 illustrates a top down view of the semiconductor workpiece of FIG. 7, in accordance with one embodiment of the present invention.
Figure 9:
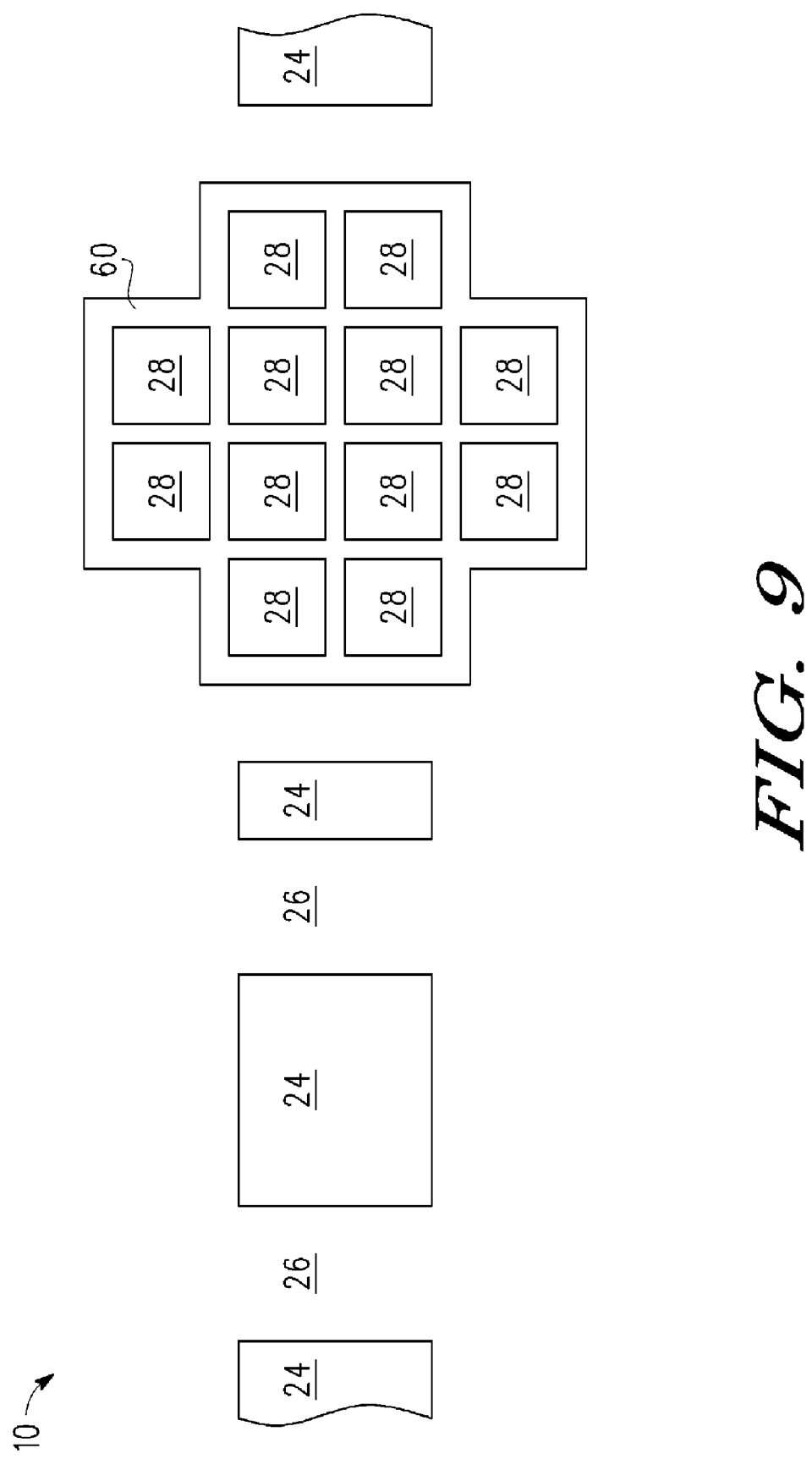

FIG. 8 illustrates a top down view of workpiece 10 corresponding to the cross section illustrated in FIG. 2. In FIG. 8, sacrificial features 22 include a number of lines, where one or more of the lines can be different lengths. Any variety of patterns (such as geometrical patterns) may be used to form one or more sacrificial features between isolation regions 28 in through-via region 16. For example, FIG. 9 illustrates a top down view of workpiece 10 in which a different pattern is used to form a sacrificial features may prevent dishing during planarization. In FIG. 9, the sacrificial feature may be formed with a single grid, where the grid lines and outline forms a sacrificial feature 60 which surrounds various isolation regions 28. FIG. 10 illustrates a top down view of workpiece 10 in which a different pattern of sacrificial features 60 is used which may prevent dishing during planarization. In FIG. 10, an array of shorter lines (as compared to special features 22) is used to form the pattern of sacrificial features 60. Alternate embodiments may use a variety of other patterns and forms to create sacrificial features in through-via region 16 where a through-via will be formed. These sacrificial features may help prevent dishing during planarization, and may be formed in such a manner that they fully erode during subsequent etching (such as when etching into substrate 12 to form the through-via opening, e.g. opening 46 in FIG. 5).

FIG. 11 illustrates, in cross section form, a semiconductor workpiece 110 after forming isolation regions 126 and 128, in accordance with one embodiment of the present invention. Workpiece 110 includes a semiconductor substrate 112, an insulating layer 127 over substrate 112, an etch stop layer 125 over insulating layer 127, an active region 114, and a through-via region 116. Semiconductor substrate 112, insulating layer 127, etch stop layer 125, active region 114, and through-via region 116 are analogous to semiconductor substrate 12, insulating layer 27, etch stop layer 25, active region 14, and through-via region 116 described in reference to FIGS. 1 and 2 above. Therefore, the descriptions provided above for semiconductor substrate 12, insulating layer 27, etch stop layer 25, active region 14, and through-via region 16 also apply to semiconductor substrate 112, insulating layer 127, etch stop layer 125, active region 114, and through-via region 116, respectively.

Still referring to FIG. 11, after formation of etch stop layer 125, isolation regions 126 and 128 may be formed in substrate 112. In one embodiment, isolation regions 126 and 128 are formed by creating isolation openings in substrate 112 which are filled with an insulating material, such as an oxide, and subsequently planarized to etch stop layer 125. Isolation regions 126 are located within active region 114 and isolation regions 128 are located within through-via region 116. Note that isolation regions 128 are closer to an edge 105 of workpiece 110 as compared to isolation regions 126. In through-via region 116, sacrificial features 122 are located between isolation regions 128. In active region 114, non-sacrificial features 124 are located between isolation regions 126. For example, in through-via region 116, each sacrificial feature of sacrificial features 122 is between two isolation regions of isolation regions 128, and in active region 114, each non-sacrificial feature of non-sacrificial features 124 is between two isolation regions of isolation regions 126. Note that the presence of sacrificial features 122 prevents dishing from occurring in through-via regions 116 during planarization of the insulating material. That is, without sacrificial features 122, isolation regions 128 would form a single, large-area, isolation region. In this case, this large-area isolation layer may be more susceptible to dishing during planarization of the insulating material. Therefore, the use of sacrificial features 122 helps prevents this dishing which may allow for better integrity of subsequently formed layers. Furthermore, as will be discussed below, sacrificial features 122 will eventually be removed during formation of a through-via. In one embodiment, sacrificial features 122 are each less than a predetermined size such that they erode during a subsequent etch to form an opening in substrate 112 for forming the through-via.

FIG. 12 illustrates, in cross section form, semiconductor workpiece 110 after formation of an opening 145 in substrate 112, in accordance with one embodiment of the present invention. In one embodiment, opening 145 is etched into substrate 112 in through-via region 116. After forming opening 145, an oxide layer 147 is formed within the opening, along the bottom and sidewalls of the opening. In one embodiment, oxide layer 147 is a thermally grown oxide layer and thus referred to as a thermal oxide layer. Alternatively, oxide layer 147 may be a deposited oxide layer. In one embodiment, opening 145 is formed such that the opening sidewalls are adjacent isolation regions of isolation regions 128, where oxide layer 147 and these adjacent isolation regions isolate opening 145 from substrate 112.

In an alternate embodiment, sacrificial features 122 may not be formed in through-via region 116. In this embodiment, one or more of isolation regions 128 described in FIG. 11 may not be formed prior to creation of opening 145.

Figure 13:
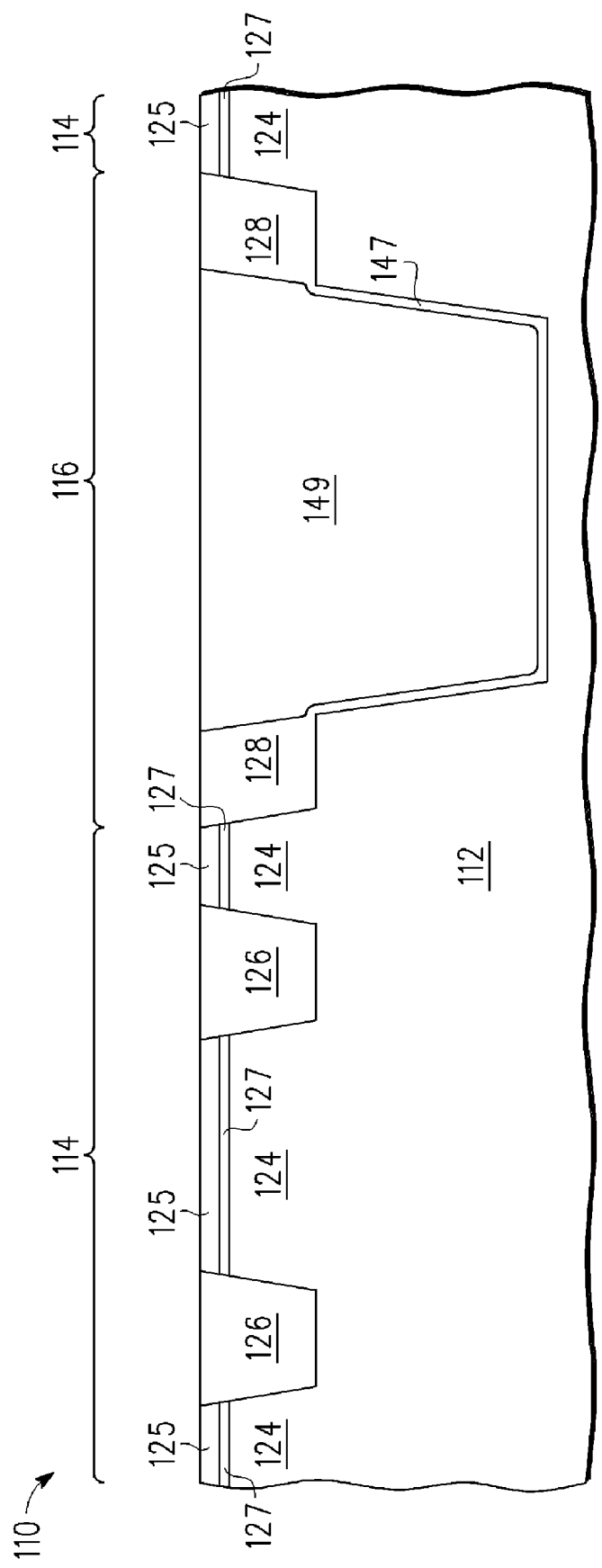
FIG. 13 illustrates, in cross section form, the semiconductor workpiece of FIG. 12 after filling the opening in the substrate, in accordance with one embodiment of the present invention.

FIG. 13 illustrates, in cross section form, semiconductor workpiece 110 after filling opening 145, in accordance with one embodiment of the present invention. Opening 145 is filled with a sacrificial fill 149 which will later be removed. In one embodiment, sacrificial fill 149 includes silicon, such as polysilicon.

Figure 14:
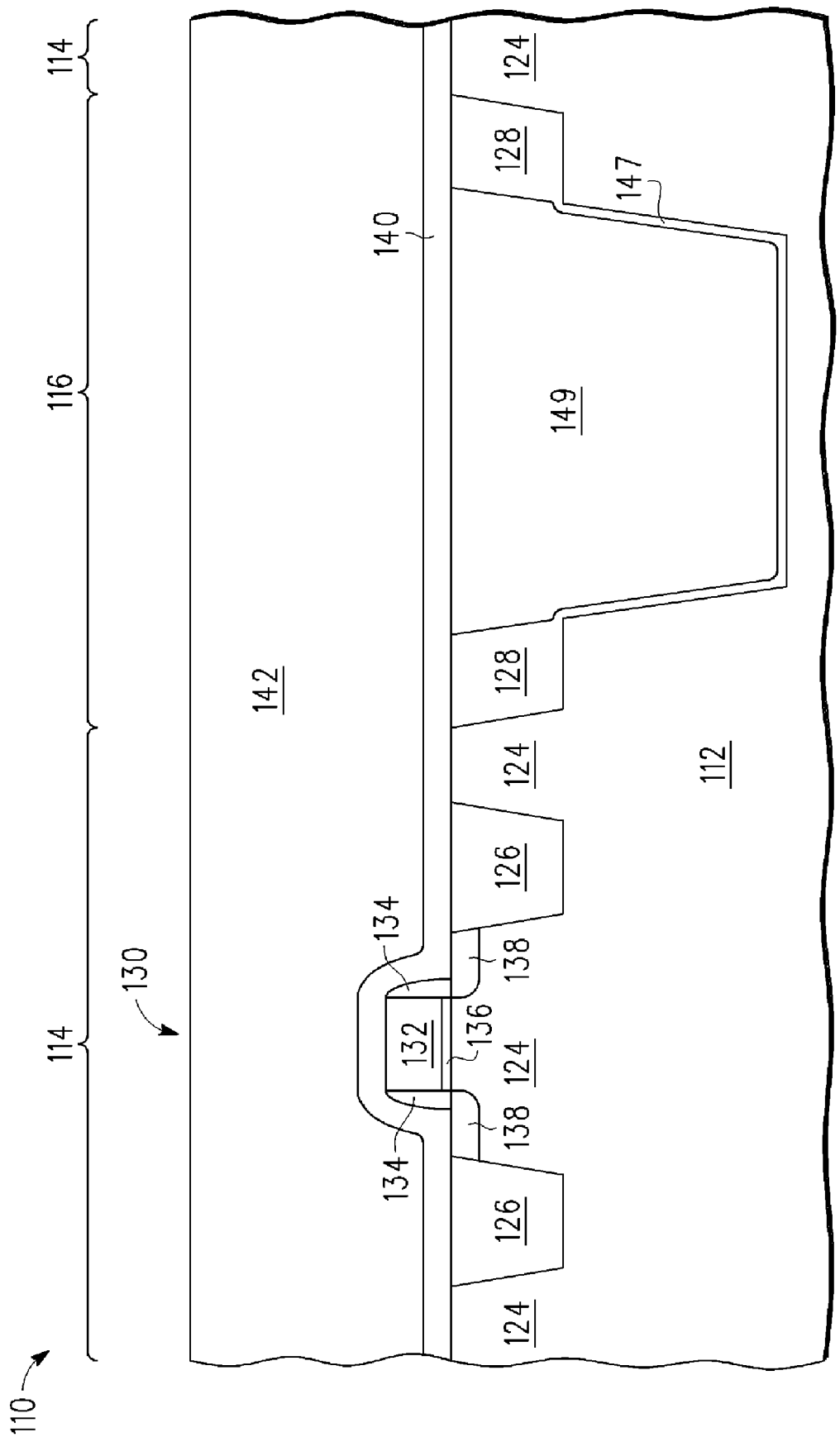
FIG. 14 illustrates, in cross section form, the semiconductor workpiece of FIG. 13 after formation of a transistor in and over the substrate, an etch stop layer over the transistor and the substrate, and a dielectric layer over the etch stop layer, in accordance with one embodiment of the present invention.

FIG. 14 illustrates, in cross section form, semiconductor workpiece 110 after formation of a transistor 130, an etch stop layer 140, and a dielectric layer 142 over etch stop layer 140, in accordance with one embodiment of the present invention. A transistor 130 is formed in and on substrate 112, between isolation regions 126. Transistor 130 is an exemplary semiconductor device and can be formed in a variety of different manners. In the illustrated embodiment, transistor 130 includes a gate dielectric 136 over substrate 112, a gate electrode 132 over gate dielectric 136, sidewall spacers 134 over substrate 112 and adjacent gate electrode 132, and source/drain regions 138 in substrate 112 on either side of gate electrode 132, between two isolation regions of isolation regions 126. Therefore, note that a channel region of transistor 130, located in substrate 112, under gate dielectric 136, and between source/drain regions 138, is formed in a non-sacrificial feature 124 of active region 114. In alternate embodiments, active region 114 may include other types of transistors, devices, and circuitry. In one embodiment, etch stop layer 140 is deposited over transistor 130, isolation regions 126, and substrate 112 in active region 114 and over isolation regions 128 and substrate 112 in through-via region 116. In one embodiment, etch stop layer 140 is a nitride layer. In one embodiment, a dielectric layer 142 is deposited over etch stop layer 140. Note that dielectric layer 142 may also be referred to as a pre-metal dielectric (PMD) and may be formed of multiple layers.

The presence of sacrificial fill 149 allows opening 145 to be used later in processing for forming a through-via, as will be discussed below. In one embodiment, sacrificial fill 149 is able to withstand the processing required to form transistor 130, etch stop layer 140, and dielectric 142.

Figure 15:
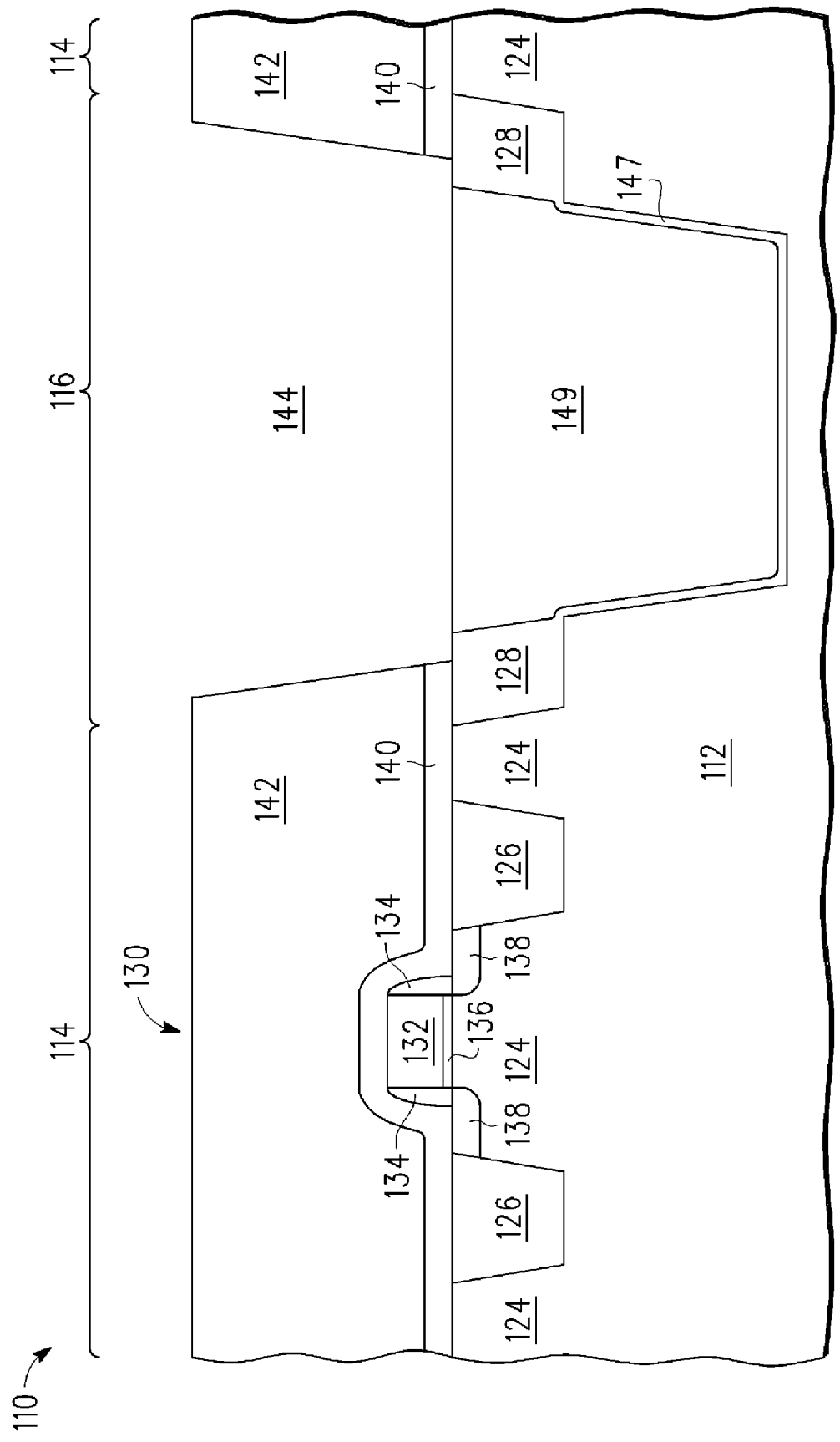
FIG. 15 illustrates, in cross section form, the semiconductor workpiece of FIG. 14 after formation of an opening through the dielectric layer and the etch stop layer, in accordance with one embodiment of the present invention.

FIG. 15 illustrates, in cross section form, semiconductor workpiece 110 after formation of a first portion of a through-via opening 144 through dielectric layer 142 and etch stop layer 140, in accordance with one embodiment of the present invention. Note that opening 144 is formed in through-via region 116 and exposes a portion of isolation regions 28 as well as sacrificial fill 149.

Figure 16:
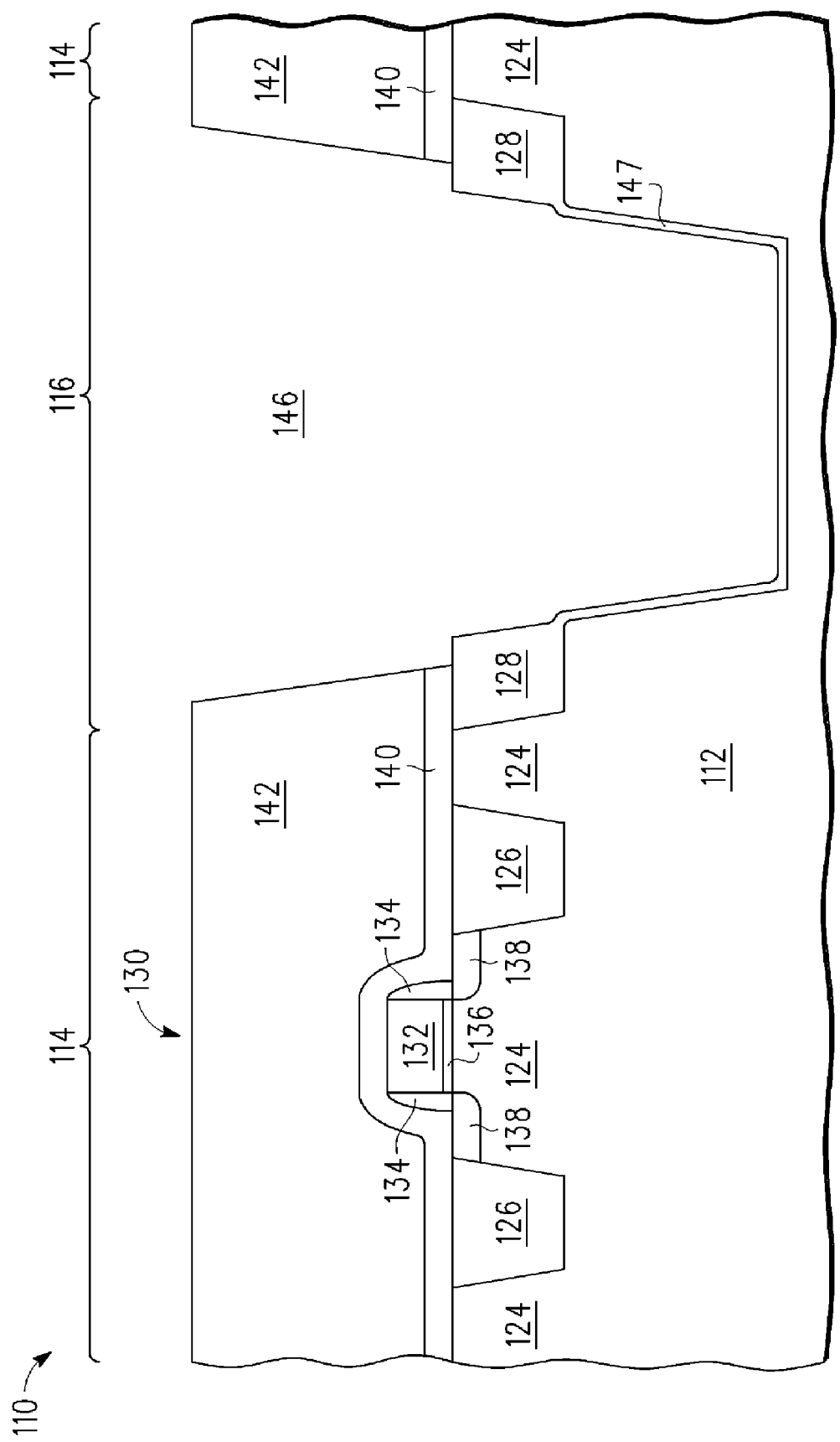
FIG. 16 illustrates, in cross section form, the semiconductor workpiece of FIG. 15 after removing the filling from the opening in the substrate formed in FIG. 12, in accordance with one embodiment of the present invention.

FIG. 16 illustrates, in cross section form, semiconductor workpiece 110 after removing sacrificial fill 149 from opening 145, in accordance with one embodiment of the present invention. In one embodiment, sacrificial fill 149 is removed by performing an etch that is selective to underlying layer 147, such a wet etch or a dry etch (e.g. a plasma etch, where the plasma etch may have a chemistry including a fluorine chemical such as $NF_3$ or a bromine chemical such as HBr). Upon removing sacrificial fill 149, a through-via opening 146 is formed which extends through dielectric layer 142 and etch stop layer 140, and into substrate 112. Therefore, note that the presence of sacrificial fill 149 maintained the integrity of the first portion of the through-via opening 145 (described in reference to FIG. 12) such that, upon removing sacrificial fill 149, a complete and improved through-via opening 146 can be formed.

Figure 17:
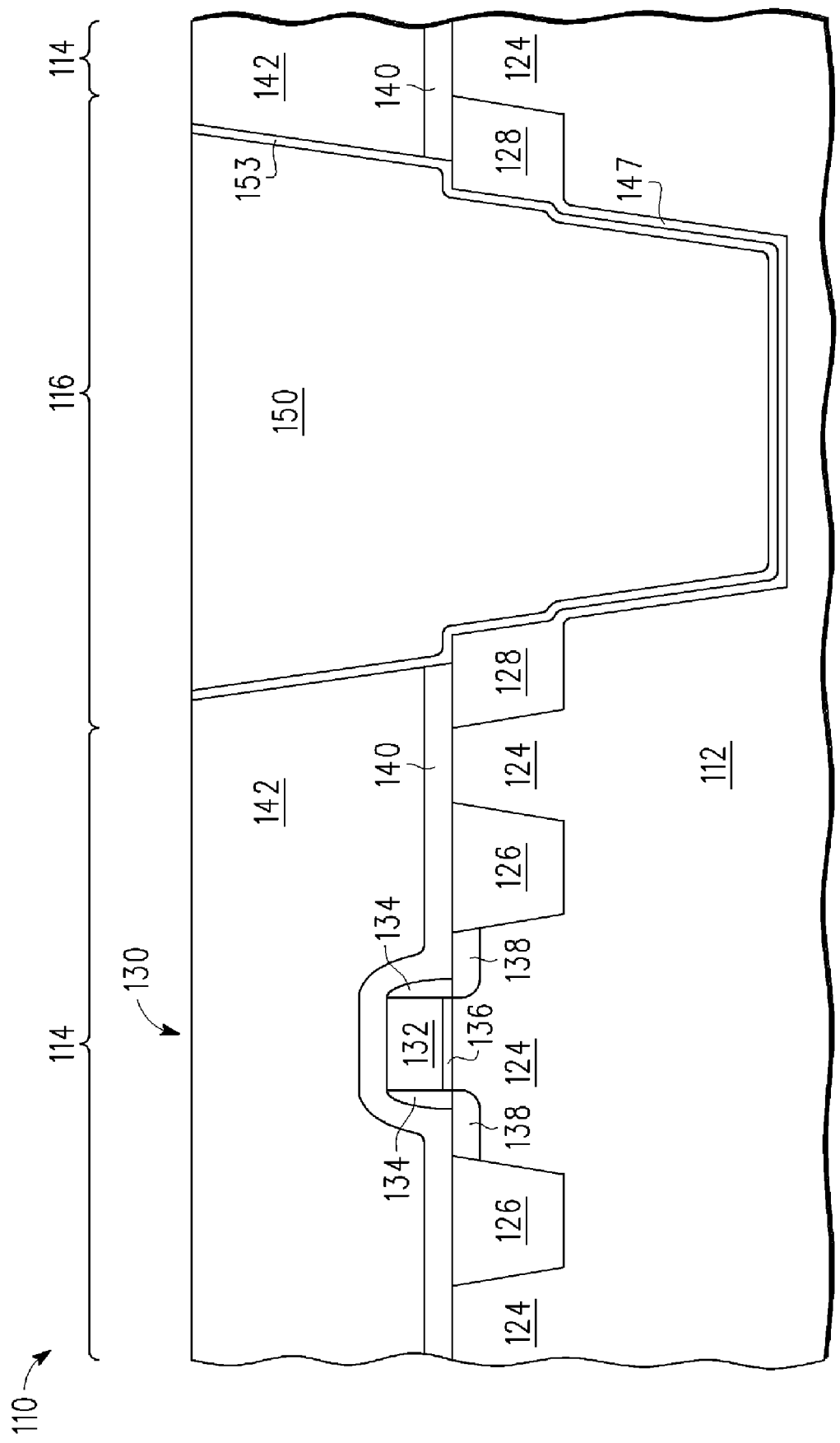
FIG. 17 illustrates, in cross section form, the semiconductor workpiece of FIG. 16 after formation of a through-via in accordance with one embodiment of the present invention.

FIG. 17 illustrates, in cross section form, semiconductor workpiece 110 after formation of a barrier layer 153 and a through-via 150 in accordance with one embodiment of the present invention. In one embodiment, barrier layer 153 is a conductive layer formed in through-via opening 146, along the bottom and sidewalls of opening 146. In one embodiment, barrier layer 153 includes tantalum. After formation of barrier layer 153, opening 146 is filled with a conductive material to form a conductive through-via 150. In one embodiment, the conductive material used to form through-via 150 includes copper or tungsten.

Figure 18:
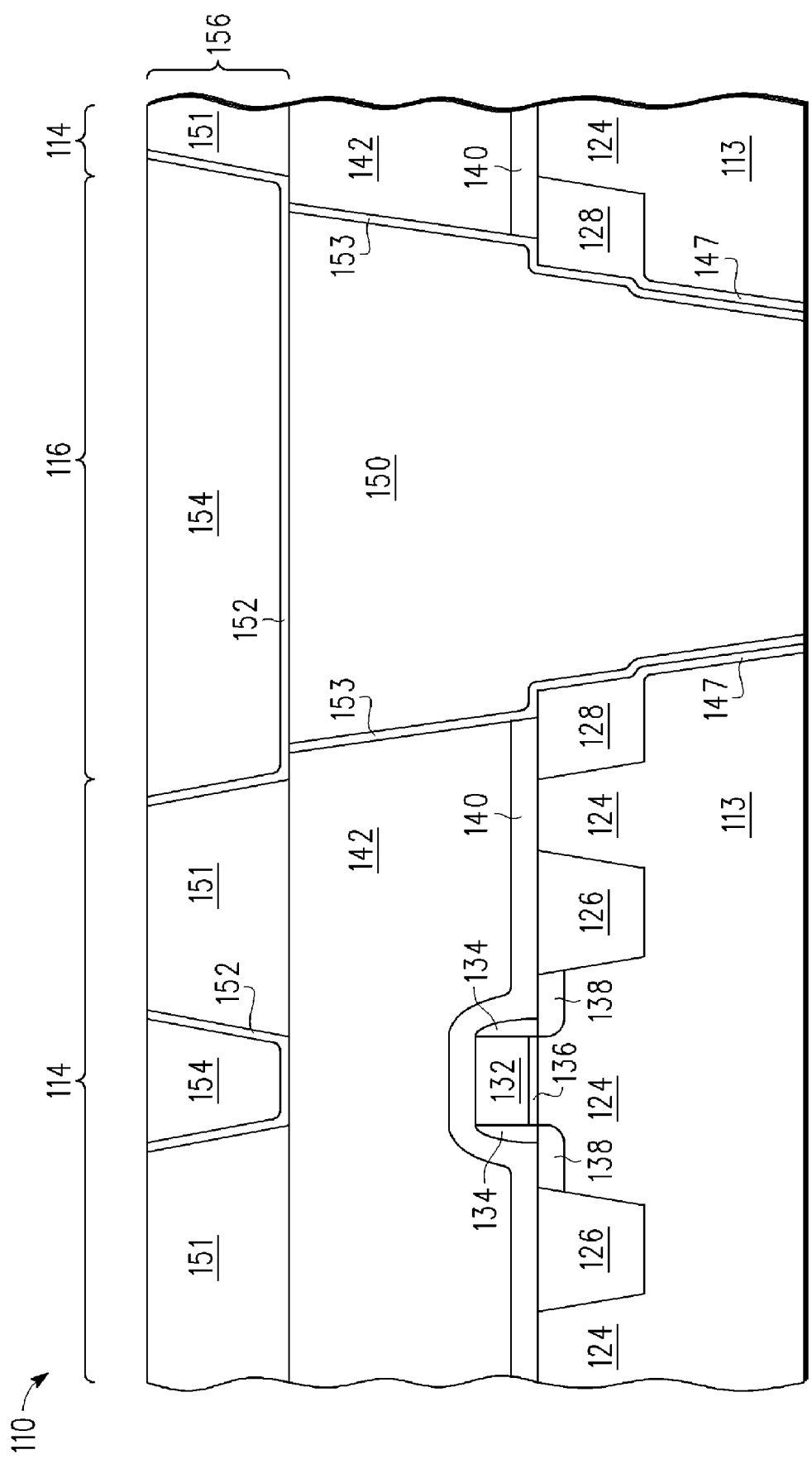
FIG. 18 illustrates, in cross section form, the semiconductor workpiece of FIG. 17 after forming an interconnect layer and after exposing the through-via, in accordance with one embodiment of the present invention.

FIG. 18 illustrates, in cross section form, semiconductor workpiece 110 after formation of an interconnect layer 156 and after exposing through-via 150, in accordance with one embodiment of the present invention. After filling opening 146 to form through-via 150, an interconnect layer 156 is formed over dielectric layer 142 and through-via 150. In one embodiment, a dielectric layer 151 is formed over dielectric layer 142 and through-via 150. Openings are formed in dielectric layer 151 exposing dielectric layer 142 and through-via 150. Within each of these openings, a conductive barrier layer 152 is formed along the bottom and sidewalls of the opening. These openings are then filled with a conductive material to form conductive regions 154. Therefore, interconnect layer 156 includes conductive regions 154 within dielectric layer 151 to route signals. Note that, in the illustrated embodiment, one of conductive regions 154 is in electrical contact with through-via 150 which may be used to route signals through through-via 150. In alternate embodiments, workpiece 110 may include any number of interconnect layers, such as interconnect layer 156, as needed to route signals. Also, as illustrated in FIG. 18, after formation of interconnect layer 156, substrate 112 is thinned to form thinned substrate 113 and expose through-via 150 at a bottom surface of substrate 113, which is opposite a top surface of substrate 113 on which etch stop layer 140 and dielectric layer 142 are formed. Therefore, through-via 150 allows signals from circuitry in active regions 114 to be routed through one or more interconnect layers on a top surface of substrate 113 down through substrate 113 itself to the bottom surface of substrate 113, opposite the top surface.

Figure 19:
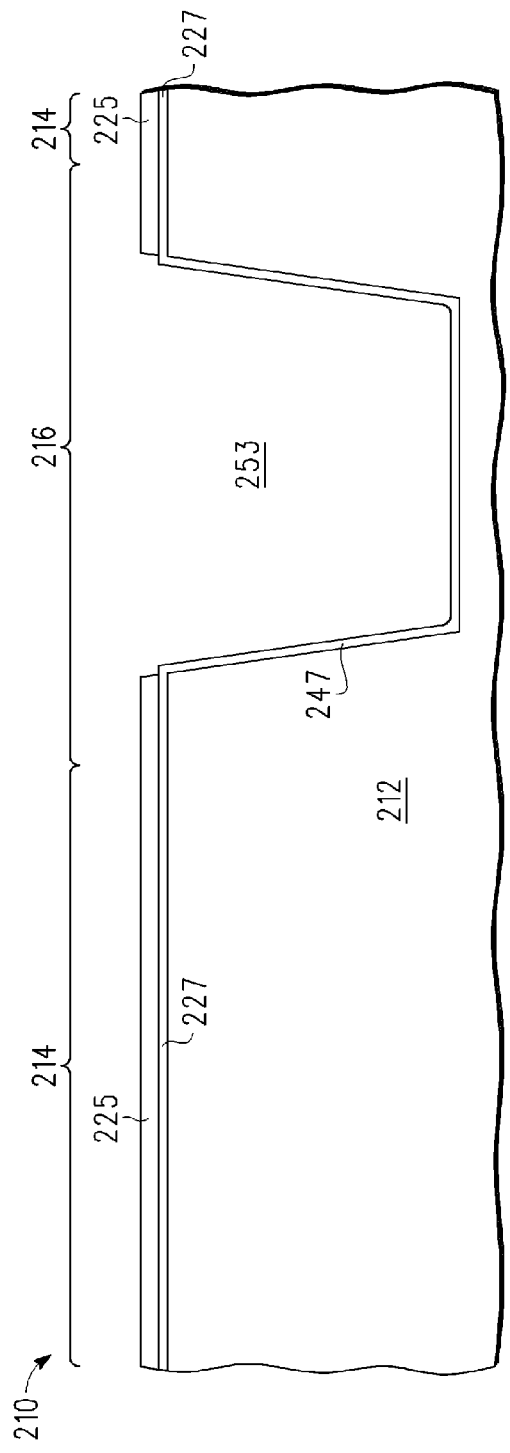
FIG. 19 illustrates, in cross section form, a semiconductor workpiece having an opening formed a semiconductor substrate, in accordance with one embodiment of the present invention.

FIG. 19 illustrates, in cross section form, a semiconductor workpiece 210 having an opening 253 formed a semiconductor substrate 212, in accordance with one embodiment of the present invention. Workpiece 210 includes a semiconductor substrate 212, an insulating layer 227 over substrate 212, an etch stop layer 225 over insulating layer 227, an active region 214, and a through-via region 216. Semiconductor substrate 212, insulating layer 227, etch stop layer 225, active region 214, and through-via region 216 are analogous to semiconductor substrate 12, insulating layer 27, etch stop layer 25, active region 14, and through-via region 16 described in reference to FIGS. 1 and 2 above. Therefore, the descriptions provided above for semiconductor substrate 12, insulating layer 27, etch stop layer 25, active region 14, and through-via region 16 also apply to semiconductor substrate 212, insulating layer 227, etch stop layer 225, active region 214, and through-via region 216, respectively.

Still referring to FIG. 19, after formation of etch stop layer 225, an opening 253 is formed in substrate 212 in through-via region 216. After formation of opening 253, an oxide layer 247 is formed within opening 253, along the bottom and sidewalls of opening 253. In one embodiment, oxide layer 247 is a thermally grown oxide layer and thus can be referred to as a thermal oxide layer. Alternatively, oxide layer 247 may be a deposited oxide layer.

Figure 20:
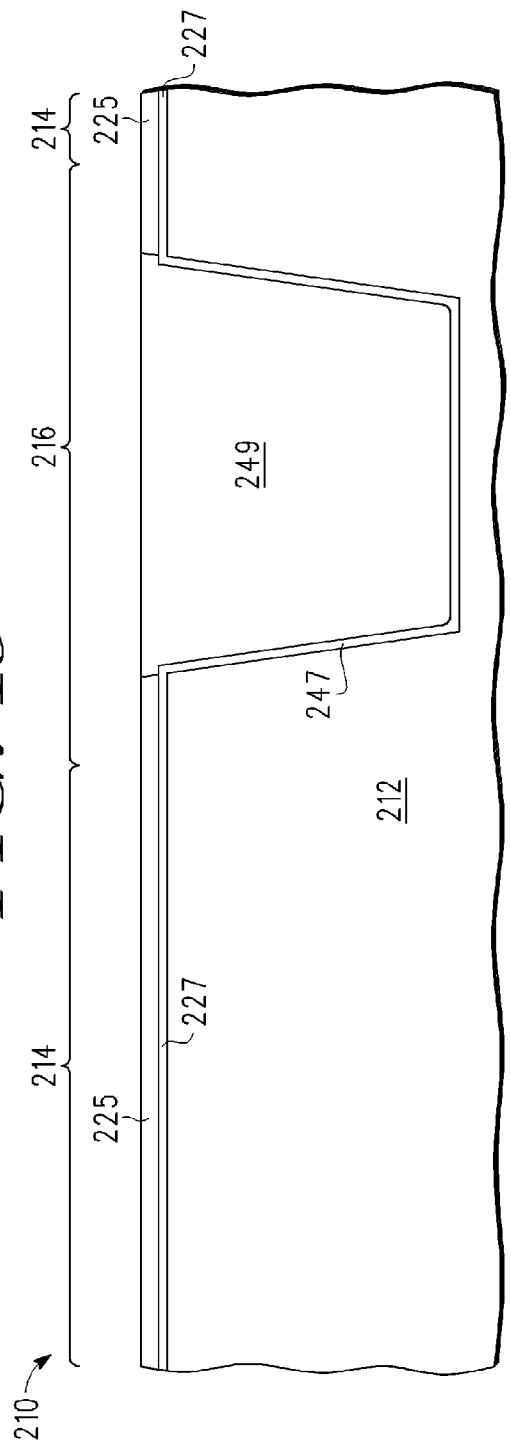
FIG. 20 illustrates, in cross section form, the semiconductor workpiece of FIG. 19 after filling the opening in the substrate, in accordance with one embodiment of the present invention.

FIG. 20 illustrates, in cross section form, semiconductor workpiece 210 after filling opening 253, in accordance with one embodiment of the present invention. Opening 253 is filled with a sacrificial fill 249 which will later be removed. In one embodiment, sacrificial fill 249 includes silicon, such as polysilicon.

Figure 21:
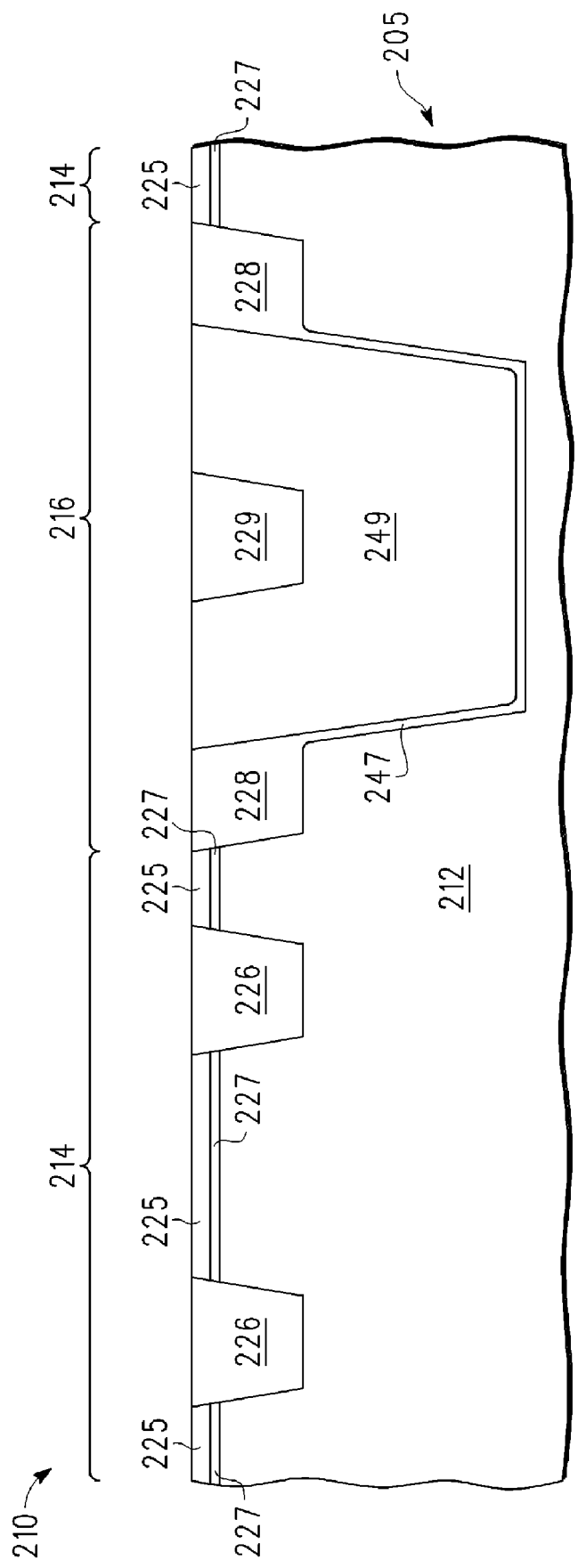
FIG. 21 illustrates, in cross section form, the semiconductor workpiece of FIG. 20 after formation of isolation regions, in accordance with one embodiment of the present invention.

FIG. 21 illustrates, in cross section form, semiconductor workpiece 210 after formation of isolation regions 226, 228, and 229, in accordance with one embodiment of the present invention. In one embodiment, isolation regions 226, 228, and 229 are formed by creating isolation openings in substrate 212 and sacrificial fill 249 which are filled with an insulating material, such as an oxide, and subsequently planarized to etch stop layer 225. Isolation region 229 is located in sacrificial fill 249. Isolation regions 226 are located within active region 214 and isolation regions 228 are located within through-via region 216. Note that isolation regions 228 are closer to an edge 205 of workpiece 210 as compared to isolation regions 226 Note that any number of isolation regions such as isolation region 229 may be formed in sacrificial fill 249 Note that the presence of isolation region 229 may help prevent planarization issues caused by a single, large-area, region which is devoid of isolation features (such as isolation regions 226 or 228). Therefore, the use of isolation region 229 may allow for better integrity of subsequently formed layers. Since isolation regions within sacrificial fill 249, such as isolation region 229, help prevent planarization issues caused by a lack of isolation regions 226 or 228, these isolation regions may also be referred to as planarization assist features. Furthermore, as will be discussed below, isolation region 229 will eventually be removed during formation of a through-via. In one embodiment, isolation region 229 are removed during a subsequent etch to remove sacrificial fill 249.

Note that, in one embodiment, isolation region 229 may not be formed in sacrificial fill 249.

Figure 22:
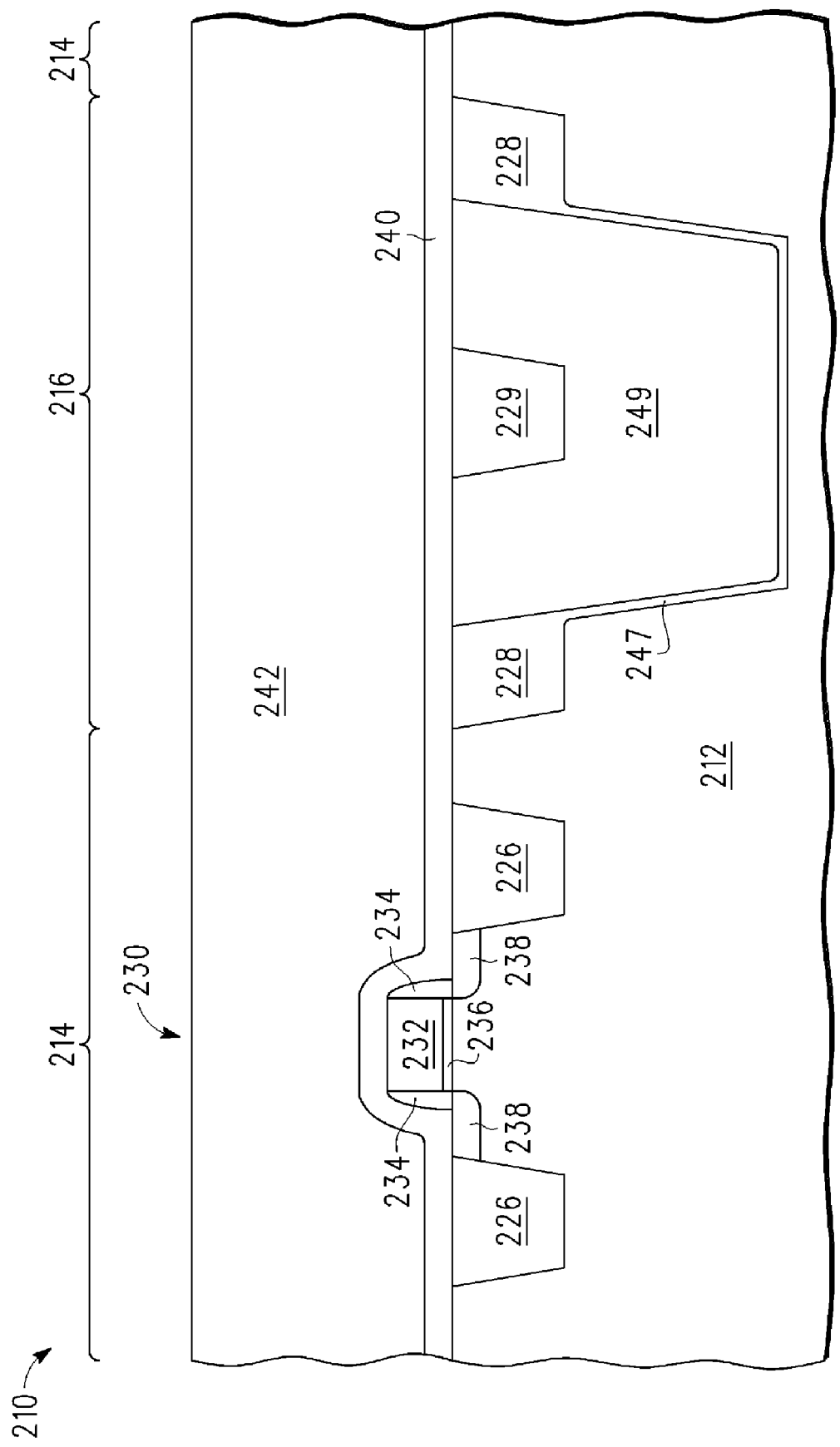
FIG. 22 illustrates, in cross section form, the semiconductor workpiece of FIG. 21 after formation of a transistor in and over the substrate, an etch stop layer over the transistor and the substrate, and a dielectric layer over the etch stop layer, in accordance with one embodiment of the present invention.

FIG. 22 illustrates, in cross section form, semiconductor workpiece 210 after formation of a transistor 230, an etch stop layer 240, and a dielectric layer 242 over etch stop layer 240, in accordance with one embodiment of the present invention. A transistor 230 is formed in and on substrate 212, between isolation regions 226. Transistor 230 is an exemplary semiconductor device and can be formed in a variety of different manners. In the illustrated embodiment, transistor 230 includes a gate dielectric 236 over substrate 212, a gate electrode 232 over gate dielectric 236, sidewall spacers 234 over substrate 212 and adjacent gate electrode 232, and source/drain regions 238 in substrate 212 on either side of gate electrode 232, between two isolation regions of isolation regions 226. Therefore, note that a channel region of transistor 230, located in substrate 212, under gate dielectric 236, and between source/drain regions 238, is formed in a non-sacrificial feature 224 of active region 214. In alternate embodiments, active region 214 may include other types of transistors, devices, and circuitry. In one embodiment, etch stop layer 240 is deposited over transistor 230, isolation regions 226, and substrate 212 in active region 214 and over isolation regions 228 and substrate 212 in through-via region 216. In one embodiment, etch stop layer 240 is a nitride layer. In one embodiment, a dielectric layer 242 is deposited over etch stop layer 240. Note that dielectric layer 242 may also be referred to as a pre-metal dielectric (PMD) and may be formed of multiple layers.

The presence of sacrificial fill 249 allows opening 253 to be used later in processing for forming a through-via, as will be discussed below. In one embodiment, sacrificial fill 249 is able to withstand the processing required to form transistor 230, etch stop layer 240, and dielectric 242.

Figure 23:
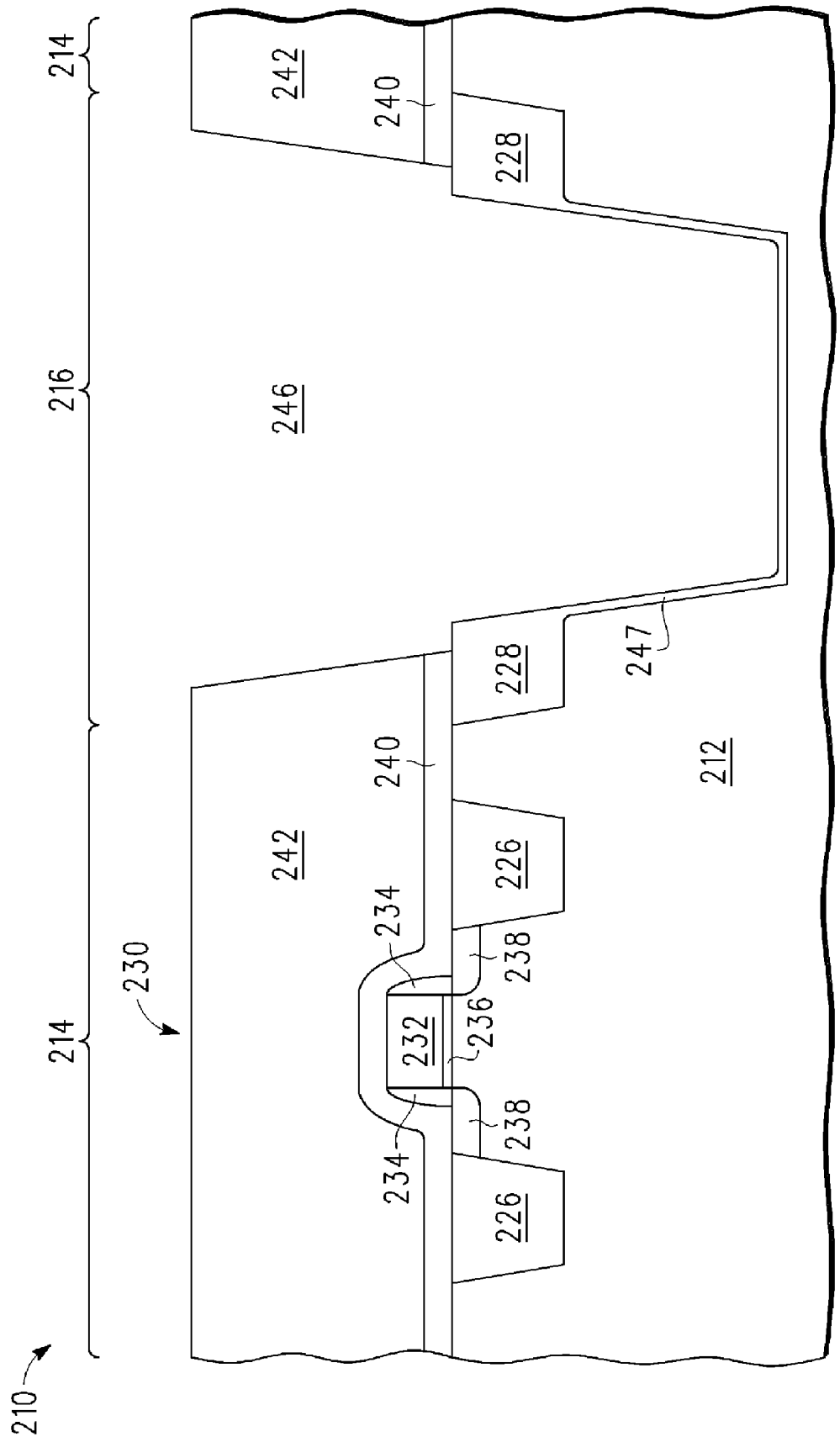
FIG. 23 illustrates, in cross section form, the semiconductor workpiece of FIG. 22 after formation of an opening through the dielectric layer, etch stop layer, and substrate, in accordance with one embodiment of the present invention.

FIG. 23 illustrates, in cross section form, semiconductor workpiece 210 after removing sacrificial fill 249 and isolation region 229 from opening 253, in accordance with one embodiment of the present invention. In one embodiment, sacrificial fill 249 is removed by performing an etch that is selective to underlying layer 247, such a wet etch or a dry etch (e.g. a plasma etch, where the plasma etch may have a chemistry including a fluorine chemical such as $NF_3$ or a bromine chemical such as HBr). Upon removing sacrificial fill 249, a through-via opening 246 is formed which extends through dielectric layer 242 and etch stop layer 240, and into substrate 212. Therefore, note that the presence of sacrificial fill 249 maintained the integrity of the first portion of the through-via opening 253 (described in reference to FIG. 19) such that, upon removing sacrificial fill 249, a complete and improved through-via opening 246 can be formed.

Figure 24:
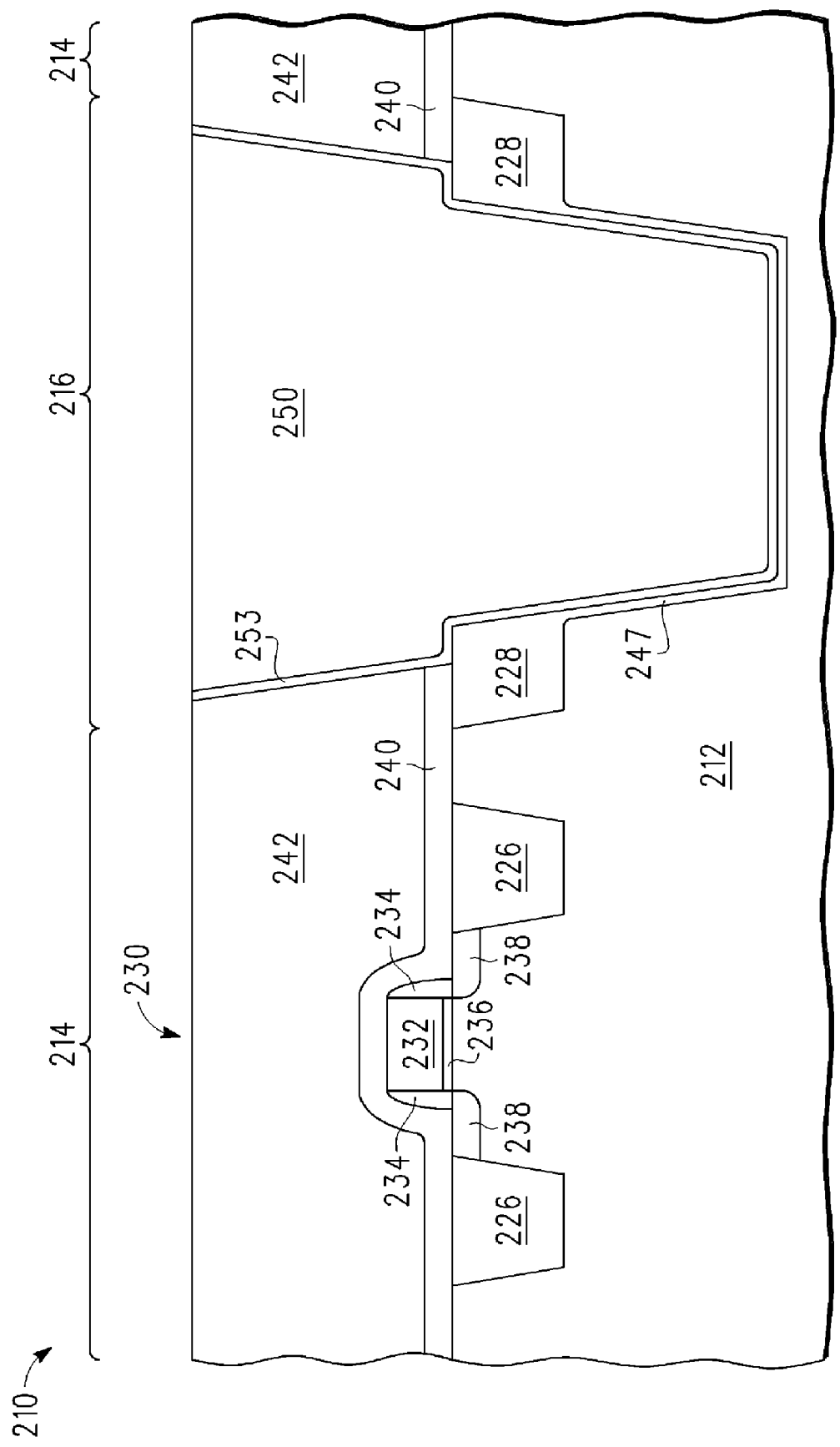
FIG. 24 illustrates, in cross section form, the semiconductor workpiece of FIG. 23 after formation of a through-via, in accordance with one embodiment of the present invention.

FIG. 24 illustrates, in cross section form, semiconductor workpiece 210 after formation of a barrier layer 253 and a through-via 250 in accordance with one embodiment of the present invention. In one embodiment, barrier layer 253 is a conductive layer formed in through-via opening 246, along the bottom and sidewalls of opening 246. In one embodiment, barrier layer 253 includes tantalum. After formation of barrier layer 253, opening 246 is filled with a conductive material to form a conductive through-via 250. In one embodiment, the conductive material used to form through-via 250 includes copper or tungsten.

Figure 25:
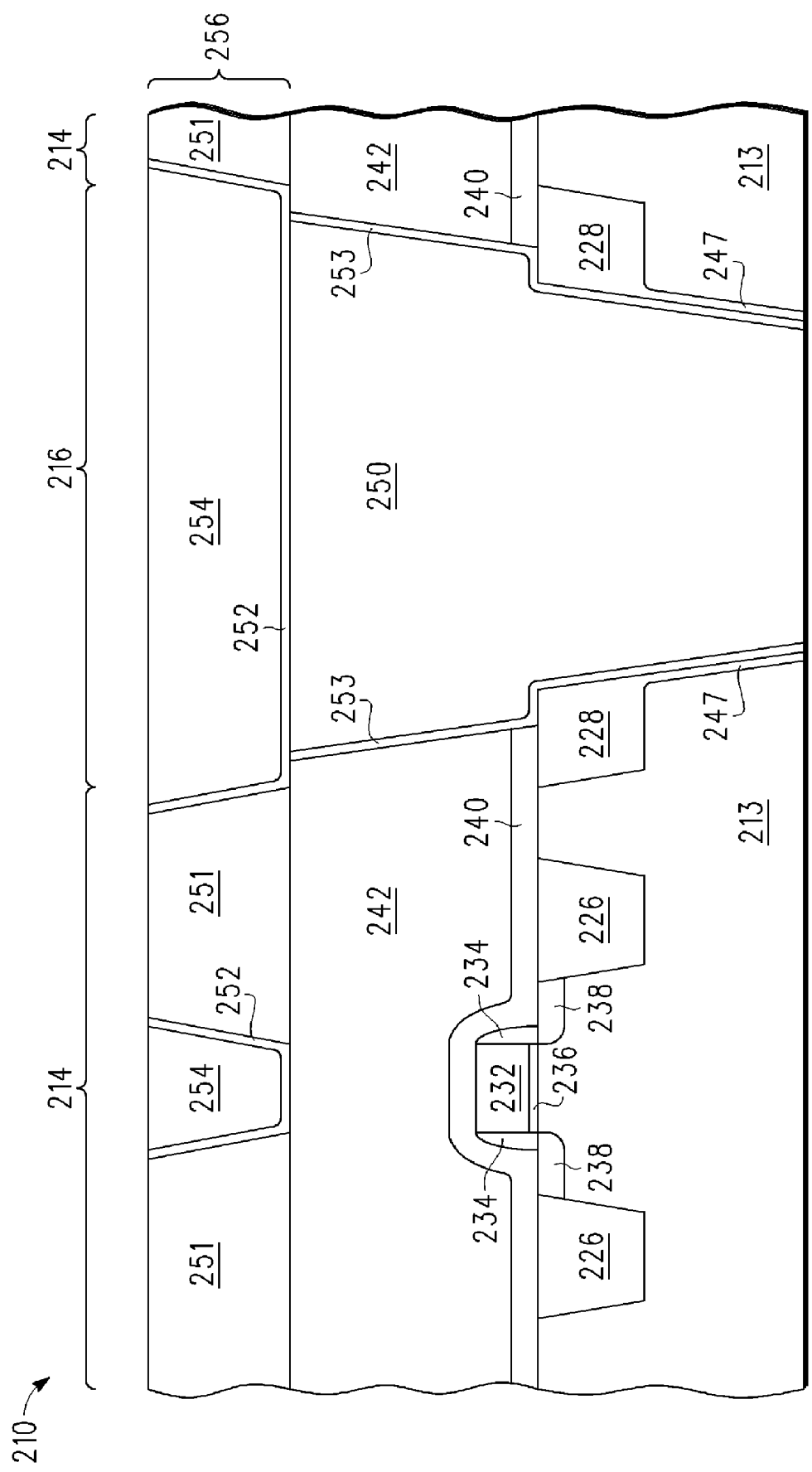
FIG. 25 illustrates, in cross section form, the semiconductor workpiece of FIG. 24 after forming an interconnect layer and after exposing the through-via, in accordance with one embodiment of the present invention.

FIG. 25 illustrates, in cross section form, semiconductor workpiece 210 after formation of an interconnect layer 256 and after exposing through-via 250, in accordance with one embodiment of the present invention. After filling opening 246 to form through-via 250, an interconnect layer 256 is formed over dielectric layer 242 and through-via 250. In one embodiment, a dielectric layer 251 is formed over dielectric layer 242 and through-via 250. Openings are formed in dielectric layer 251 exposing dielectric layer 242 and through-via 250. Within each of these openings, a conductive barrier layer 252 is formed along the bottom and sidewalls of the opening. These openings are then filled with a conductive material to form conductive regions 254. Therefore, interconnect layer 256 includes conductive regions 254 within dielectric layer 251 to route signals. Note that, in the illustrated embodiment, one of conductive regions 254 is in electrical contact with through-via 250 which may be used to route signals through through-via 250. In alternate embodiments, workpiece 210 may include any number of interconnect layers, such as interconnect layer 256, as needed to route signals. Also, as illustrated in FIG. 25, after formation of interconnect layer 256, substrate 212 is thinned to form thinned substrate 213 and expose through-via 250 at a bottom surface of substrate 213, which is opposite a top surface of substrate 213 on which etch stop layer 240 and dielectric layer 242 are formed. Therefore, through-via 250 allows signals from circuitry in active regions 214 to be routed through one or more interconnect layers on a top surface of substrate 213 down through substrate 213 itself to the bottom surface of substrate 213, opposite the top surface.

By now it should be appreciated that there has been provided a method for forming a through-via in which sacrificial features may be used to allow for improved through-via formation. For example, sacrificial features may be formed between isolation openings, such that when the isolation openings are filled with an oxide and planarized to form isolation regions, dishing may be decreased.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes method of forming a via including forming an first opening in the semiconductor substrate, wherein the first opening has a bottom and sidewalls, forming a sacrificial fill in the first opening, forming a dielectric layer over the sacrificial fill, forming a second opening in the dielectric layer, wherein the second opening is over the sacrificial fill, removing the sacrificial fill from the first opening after forming the second opening, and forming a conductive material in the first opening and second opening. Item 2 includes the method of item 1, further including thermally oxidizing the bottom of the first opening and at least a portion of the sidewalls of the first opening, Item 3 the method of item 1, further including forming a dielectric liner along the bottom of the first opening and at least a portion of the sidewalls of the first opening, wherein the step of forming the sacrificial fill including depositing polysilicon in the first opening after the step of forming the dielectric liner. Item 4 includes the method of item 1, further including forming a barrier layer in the first opening and the second opening, wherein forming the barrier layer is performed before forming the conductive material. Item 5 includes the method of item 1, further including removing a portion of the semiconductor substrate to expose the conductive material. Item 6 includes the method of item 1, further including forming isolation regions in the semiconductor substrate, wherein the sacrificial fill is between the isolation openings. Item 7 includes the method of item 6, further including forming a sacrificial feature in the sacrificial fill, wherein the sacrificial region is between the isolation regions and the sacrificial feature is removed when removing the sacrificial region. Item 8 includes the method of item 1, wherein forming the sacrificial fill in the first opening, includes forming polysilicon in the first opening.

Item 9 includes a method of forming a via, the method including providing a semiconductor substrate having a through-via region, forming an first opening in the semiconductor substrate in the through-via region, thermally oxidizing a portion of a surface of the first opening, forming a material including silicon in the first opening, forming a dielectric layer over the semiconductor substrate, forming a second opening in the dielectric layer, wherein the second opening is over the first opening, removing the material including silicon from the first opening, and forming a conductive material in the first opening and second opening. Item 10 includes the method of item 9, further including forming a barrier layer in the first opening and the second opening, wherein forming the barrier layer is performed before forming the conductive material. Item 11 includes the method of item 9, further including removing a portion of the semiconductor substrate to expose the conductive material. Item 12 includes the method of item 11, further including forming isolation openings in the through-via region, wherein the first opening is between the isolation openings, and forming a dielectric material in the isolation openings to form isolation regions. Item 13 includes the method of item 12, further including forming a sacrificial feature in the material including silicon, wherein the sacrificial region is between the isolation regions. Item 14 includes the method of item 9, wherein the step of removing the material including silicon from the first opening includes etching the material including silicon from the first opening. Item 15 includes the method of item 9, wherein providing the semiconductor substrate, further includes an active region having a device, wherein the through-via region is closer to the edge of the die than the device. Item 16 includes the method of item 9, wherein forming the material including silicon in the first opening includes depositing polysilicon in the first opening.

Item 17 includes a method of forming a via including etching an first opening in the semiconductor substrate, thermally oxidizing at least a portion of the first opening to form an oxide, forming a sacrificial fill in the first opening after the step of thermally oxidizing the at least the portion of the first opening, depositing a dielectric layer over the sacrificial fill, etching a second opening in the dielectric layer, wherein the second opening is over the sacrificial fill, removing the sacrificial fill and that oxide from the first opening, wherein the step of removing the sacrificial fill and the oxide occurs after the step of etching the second opening, depositing a barrier layer in the second opening and the first opening after the step of removing the sacrificial fill and the oxide, and depositing a conductive material in the first opening and second opening after the step of depositing the barrier layer. Item 18 includes the method of item 17, wherein forming a sacrificial fill includes forming polysilicon. Item 19 includes the method of item 17, further including forming isolation openings in the through-via region, wherein the first opening is between the isolation openings, and forming a dielectric material in the isolation openings to form isolation regions. Item 20 includes the method of item 17, wherein the step of removing the sacrificial fill includes etching the sacrificial fill.

What is claimed is:

1. A method of forming a via comprising:
   forming a first opening in the semiconductor substrate, wherein the first opening has a bottom and sidewalls;
   forming a sacrificial fill in the first opening;
   forming a dielectric layer over the sacrificial fill;
   forming a second opening in the dielectric layer, wherein the second opening is over the sacrificial fill;
   removing the sacrificial fill from the first opening after forming the second opening; and
   after the removing the sacrificial fill from the first opening, forming a conductive material in the first opening and second opening,
   wherein forming the sacrificial fill in the first opening comprises forming polysilicon in the first opening.

2. The method of claim 1, further comprising:
thermally oxidizing the bottom of the first opening and at least a portion of the sidewalls of the first opening.

3. The method of claim 1, further comprising:
forming a dielectric liner along the bottom of the first opening and at least a portion of the sidewalls of the first opening; wherein the step of forming the sacrificial fill comprising depositing polysilicon in the first opening after the step of forming the dielectric liner.

4. The method of claim 1, further comprising:
forming a barrier layer in the first opening and the second opening, wherein forming the barrier layer is performed before forming the conductive material.

5. The method of claim 1, further comprising:
after the forming the conductive material in the first opening and second opening, removing a portion of the semiconductor substrate to expose the conductive material.

6. A method of forming a via comprising:
forming a first opening in the semiconductor substrate, wherein the first opening has a bottom and sidewalls;
forming a sacrificial fill in the first opening;
forming a dielectric layer over the sacrificial fill;
forming a second opening in the dielectric layer, wherein the second opening is over the sacrificial fill;
removing the sacrificial fill from the first opening after forming the second opening;
after the removing the sacrificial fill from the first opening, forming a conductive material in the first opening and second opening; and
forming isolation regions in the semiconductor substrate, wherein the sacrificial fill is between the isolation openings.

7. The method of claim 6, further comprising:
forming a sacrificial feature in the sacrificial fill, wherein the sacrificial region is between the isolation regions and the sacrificial feature is removed when removing the sacrificial region.

8. A method of forming a via, the method comprising:
providing a semiconductor substrate having a through-via region;
forming an first opening in the semiconductor substrate in the through-via region;
thermally oxidizing a portion of a surface of the first opening;
forming a material comprising silicon in the first opening;
forming a dielectric layer over the semiconductor substrate;
forming a second opening in the dielectric layer, wherein the second opening is over the first opening;
after the forming the second opening in the dielectric layer, removing the material comprising silicon from the first opening; and
after the removing the material comprising silicon from the first opening, forming a conductive material in the first opening and second opening,
wherein forming the material comprising silicon in the first opening comprises depositing polysilicon in the first opening.

9. The method of claim 8, further comprising:
forming a barrier layer in the first opening and the second opening, wherein forming the barrier layer is performed before forming the conductive material.

10. The method of claim 8, further comprising:
after the forming the conductive material in the first opening and second opening, removing a portion of the semiconductor substrate to expose the conductive material.

11. A method of forming a via, the method comprising:
providing a semiconductor substrate having a through-via region;
forming an first opening in the semiconductor substrate in the through-via region;
thermally oxidizing a portion of a surface of the first opening;
forming a material comprising silicon in the first opening;
forming a dielectric layer over the semiconductor substrate;
forming a second opening in the dielectric layer, wherein the second opening is over the first opening;
after the forming the second opening in the dielectric layer, removing the material comprising silicon from the first opening;
after the removing the material comprising silicon from the first opening, forming a conductive material in the first opening and second opening;
forming isolation openings in the through-via region, wherein the first opening is between the isolation openings; and
forming a dielectric material in the isolation openings to form isolation regions.

12. The method of claim 11, further comprising:
forming a sacrificial feature in the material comprising silicon, wherein the sacrificial region is between the isolation regions.

13. The method of claim 8, wherein the step of removing the material comprising silicon from the first opening comprises etching the material comprising silicon from the first opening.

14. The method of claim 8, wherein providing the semiconductor substrate, further comprises an active region having a device, wherein the through-via region is closer to the edge of the die than the device.

15. The method of claim 6, further comprising:
thermally oxidizing the bottom of the first opening and at least a portion of the sidewalls of the first opening.

16. The method of claim 6, further comprising:
forming a dielectric liner along the bottom of the first opening and at least a portion of the sidewalls of the first opening; wherein the step of forming the sacrificial fill comprising depositing polysilicon in the first opening after the step of forming the dielectric liner.

17. The method of claim 6, further comprising:
forming a barrier layer in the first opening and the second opening, wherein forming the barrier layer is performed before forming the conductive material.

18. The method of claim 6, further comprising:
after the forming the conductive material in the first opening and second opening, removing a portion of the semiconductor substrate to expose the conductive material.

19. The method of claim 6, wherein forming the sacrificial fill in the first opening, comprises forming polysilicon in the first opening.

20. The method of claim 11, further comprising:
forming a barrier layer in the first opening and the second opening, wherein forming the barrier layer is performed before forming the conductive material.

* * * * *